United States Patent
Lu et al.

(10) Patent No.: US 9,813,086 B2
(45) Date of Patent: Nov. 7, 2017

(54) RF TRANSMITTER, INTEGRATED CIRCUIT DEVICE, WIRELESS COMMUNICATION UNIT AND METHOD THEREFOR

(71) Applicant: MediaTek Singapore Pte. Ltd., Singapore (SG)

(72) Inventors: Chao Lu, Fremont, CA (US); Hua Wang, San Francisco, CA (US); Paul Cheng Po Liang, Hsinchu County (TW); Sang Won Son, Palo Alto, CA (US)

(73) Assignee: MediaTek Singapore Pte. Ltd, Solaris (SG)

( * ) Notice: Subject to any disclaimer, the term of this patent is extended or adjusted under 35 U.S.C. 154(b) by 65 days.

(21) Appl. No.: 13/972,924

(22) Filed: Aug. 22, 2013

(65) Prior Publication Data
US 2014/0177755 A1    Jun. 26, 2014

Related U.S. Application Data

(60) Provisional application No. 61/740,584, filed on Dec. 21, 2012.

(51) Int. Cl.
*H04B 1/04* (2006.01)
*H03F 1/02* (2006.01)
(Continued)

(52) U.S. Cl.
CPC ........... *H04B 1/0475* (2013.01); *H03F 1/025* (2013.01); *H03F 1/0294* (2013.01);
(Continued)

(58) Field of Classification Search
CPC .................................................... H03F 1/3241
(Continued)

(56) References Cited

U.S. PATENT DOCUMENTS 6,973,141 B1* 12/2005 Isaksen ............ H04L 25/03834
                                                     332/100
7,532,679 B2*  5/2009 Staszewski ............... H03F 3/24
                                                     375/295
(Continued)

FOREIGN PATENT DOCUMENTS

| CN | 101247153 A  | 8/2008  |
| CN | 102752246 A  | 10/2012 |
| EP | 2515445 A1   | 10/2012 |

OTHER PUBLICATIONS

Zhou, A 10-Bit, 100-MHz CMOS Linear Interpolation DAC, pp. 471-474, ESSCIRC 2002.
(Continued)

*Primary Examiner* — Daniel Washburn
*Assistant Examiner* — Berhanu Tadese
(74) *Attorney, Agent, or Firm* — Optimus Patents US, LLC

(57) ABSTRACT

A radio frequency (RF) transmitter includes a power amplifier comprising a plurality of power amplifier cells. At least one digital signal processing module of the RF transmitter is operably coupled to the power amplifier and comprises at least one digital pre-distortion component arranged to apply at least one digital pre-distortion codeword to the plurality of power amplifier cells, wherein the at least one digital pre-distortion codeword is applied to at least one of the plurality of power amplifier cells via a digital filter. A combiner is arranged to combine outputs of the plurality of power amplifier cells thereby generating an analogue RF signal for transmission over an RF interface based at least partly on the digitally filtered at least one digital pre-distortion codeword.

15 Claims, 19 Drawing Sheets

(51) Int. Cl.
*H03F 1/32* (2006.01)
*H03F 3/195* (2006.01)
*H03F 3/21* (2006.01)
*H03F 3/24* (2006.01)

(52) U.S. Cl.
CPC ........... *H03F 1/3241* (2013.01); *H03F 3/195* (2013.01); *H03F 3/211* (2013.01); *H03F 3/24* (2013.01); *H04B 1/0483* (2013.01); *H03F 2200/336* (2013.01); *H03F 2200/537* (2013.01); *H03F 2200/541* (2013.01); *H04B 2001/0408* (2013.01); *H04B 2001/0425* (2013.01)

(58) Field of Classification Search
USPC ........................................................ 375/295
See application file for complete search history.

(56) References Cited

U.S. PATENT DOCUMENTS

| | | | | |
|---|---|---|---|---|
| 7,809,081 B2* | 10/2010 | Cai | ...................... | H03F 1/3247 330/149 |
| 8,000,664 B2* | 8/2011 | Khorram | ............. | H03F 3/45188 455/127.1 |
| 8,004,368 B2* | 8/2011 | Presti | ...................... | H03C 1/00 330/10 |
| 8,154,339 B2* | 4/2012 | Zolghadri et al. | ........ | 330/124 R |
| 8,326,239 B1* | 12/2012 | Peiris | .................. | H04B 1/0475 455/114.3 |
| 8,340,602 B1* | 12/2012 | Peiris | .................. | H04B 1/0475 455/114.3 |
| 8,410,843 B2* | 4/2013 | Goodman et al. | ............ | 327/551 |
| 8,611,459 B2* | 12/2013 | McCallister | ...... | H04L 25/03343 330/149 |
| 2001/0050592 A1* | 12/2001 | Wright | .................. | H03F 1/3241 330/2 |
| 2002/0101937 A1* | 8/2002 | Antonio | ................ | H03F 1/3241 375/297 |
| 2002/0145470 A1* | 10/2002 | Staudinger | ................ | H03F 1/34 330/149 |
| 2004/0257157 A1* | 12/2004 | Sahlman | ............... | H03F 1/3258 330/149 |
| 2006/0291589 A1* | 12/2006 | Eliezer | ..................... | H03C 3/40 375/302 |
| 2007/0188243 A1* | 8/2007 | Waheed | ................... | H03C 5/00 331/16 |
| 2007/0188244 A1* | 8/2007 | Waheed | .................. | H03L 7/099 331/16 |
| 2008/0129379 A1* | 6/2008 | Copeland | .............. | H03F 1/3241 330/149 |
| 2009/0088093 A1* | 4/2009 | Nentwig | .................. | H03F 1/3241 455/114.3 |
| 2011/0050344 A1* | 3/2011 | He | ....................... | H04B 1/0483 330/276 |
| 2011/0068865 A1* | 3/2011 | Mohamadi | ................ | H01P 5/12 330/124 R |
| 2011/0103508 A1* | 5/2011 | Mu | ......................... | H03F 3/195 375/295 |
| 2012/0176190 A1* | 7/2012 | Goodman | ........... | H03M 1/1052 327/551 |
| 2012/0252382 A1* | 10/2012 | Bashir | ..................... | H03F 3/217 455/114.3 |
| 2012/0269291 A1* | 10/2012 | Wang | .................... | H04L 27/367 375/297 |
| 2012/0269292 A1* | 10/2012 | Wang | .................... | H04B 1/0475 375/297 |
| 2012/0269293 A1* | 10/2012 | Peng | .................... | H04B 1/0475 375/297 |
| 2013/0094611 A1* | 4/2013 | Lai | ........................ | H03F 3/2176 375/297 |
| 2013/0163697 A1* | 6/2013 | Moser | ..................... | H04L 27/04 375/300 |

OTHER PUBLICATIONS

Kavousian, A Digitally Modulated Polar CMOS Power Amplifier With a 20-MHz Channel Bandwidth, IEEE Journal of Solid-State Circuits, pp. 2251-2258, vol. 43, No. 10, Oct. 2008.

He, A 1.2V, 17dBm Digital Polar CMOS PA with Transformer-based Power Interpolating, pp. 486-489, 2008 IEEE.

* cited by examiner

RF TRANSMITTER, INTEGRATED CIRCUIT DEVICE, WIRELESS COMMUNICATION UNIT AND METHOD THEREFOR

CROSS REFERENCE TO RELATED APPLICATIONS

This application claims the benefit of U.S. provisional application No. 61/740,584, filed on Dec. 21, 2012 and incorporated herein by reference.

BACKGROUND

The field of this invention relates to a radio frequency transmitter, an integrated circuit device, a wireless communication unit and a method therefore. The invention is applicable to, but not limited to, a method of generating a radio frequency signal for transmission over a radio frequency (RF) interface.

Advances in the deep sub-micron CMOS (Complimentary Metal-Oxide Semiconductor) process have lead to digital circuits becoming smaller and more power efficient. However, it is known that analogue circuits do not scale particularly well with the deep sub-micron CMOS process. It is therefore desirable for devices, such as radio frequency (RF) transmitters, to remove as many analogue components or circuits as possible, for example with the assistance of digital signal processing algorithms, in order to be able to benefit from more use of deep sub-micron CMOS processes.

Furthermore, a large number of conventional RF transmitters use linear power amplifiers. Accordingly, the power efficiency of such conventional RF transmitters is usually very low, due to the low efficiency of the linear PAs used therein. Switch-mode PAs have very high efficiency in comparison, which make such switch-mode PAs an attractive alternative to conventional linear PAs within RF transmitters. Thus, an RF transmitter that is able to utilize switch-mode PAs through the assistance of digital processing algorithms in order to reduce a PA's size and improve a PA's power efficiency is highly desirable. However, switch-mode PAs normally exhibit a highly non-linear input-output relationship. Furthermore, in order to meet stringent co-existence requirements of various wireless standards, noise shaping techniques are often required.

Digital polar transmitters are a type of known transmitter design that utilizes switch-mode PAs, whilst also taking advantage of CMOS process technology. Accordingly, such digital polar transmitters are able to achieve high power efficiency, whilst requiring only a small silicon area. However, a problem with these known transmitter designs is that, due to the inherent bandwidth expansion characteristics of the AM (amplitude modulation) and PM (phase modulation) signals in a polar architecture, they are only suitable for narrowband modulated signals.

Hybrid polar transmitter designs take advantage of two dimensional (in-phase/quadrature) modulation to enable wideband phase modulation to achieved. However, a problem with such hybrid polar transmitters is that they suffer from both amplitude and phase quantization noise, thus requiring significant noise shaping.

In-phase/Quadrature (IQ) RF digital-to-analogue converter (DAC) based transmitters are also known. I/Q RF DACs combine the functionalities of a DAC and a mixer, with the output of the I/Q RF DAC being combined in the analogue (RF) domain. However, such transmitter designs require a linear PA, and direct I/Q RF digital-to-analogue conversion is less power efficient than a digital polar transmitter design.

Another known (predominantly narrowband) RF transmitter design utilizes adaptive pre-distortion using a delta-sigma modulator for automatic inversion of power amplifier non-linearity. Such a design is relatively simple and allows for a use of low-precision DACs. However, this design still comprises a generally conventional architecture, and so PA efficiency is low.

It is anticipated that digitally-assisted/digitally-intensive RF transmitters will become increasingly desirable. However, digital algorithms are limited by the availability of circuit speed; therefore finding simple and effective digital algorithms is crucial from an implementation perspective.

Referring first to FIG. 1, there is illustrated a simplified block diagram of an example of a digital-to-RF converter 100 for performing modulation of a radio frequency (RF) signal. The digital-to-RF converter 100 is arranged to receive an RF signal, which in the illustrated example comprises a constant envelope RF signal 110, perform modulation of the received RF signal in a digital-to-RF transmitter 140 in accordance with a received digital codeword signal 120, and to output a modulated RF signal 130 accordingly. The digital-to-RF transmitter 140 does not have an analog base-band signal that is typically present in conventional transmitters. In contrast, a digital codeword signal (digital control word) 120 is mixed with the RF signal directly. The output waveform is an RF modulated signal 130.

FIG. 2 illustrates the known architecture for generating and applying a suitable digital codeword signal (digital control word) 120 to the digital-to-RF transmitter 140. A digital pre-distortion (DPD) codeword is created in module 205 and input to a first digital power amplifier circuit (DPA 1) 210. The DPD codeword created in module 205 is also input to a second digital power amplifier circuit (DPA 2) 220 via a delay 215 to create a quadrature version of the DPD codeword 205. The outputs from the first digital power amplifier circuit 210 and the second digital power amplifier circuit 220 are applied to a summing module 230 and the summed RF power amplified signal is output 235.

One problem associated with every digital RF transmitter is that digital codewords that control any analog block inside a digital RF transmitter only change at a certain frequency. Thus, the RF output spectrum of every digital RF transmitter presents a periodic spectrum repetition due to digital sampling, commonly referred to as digital-to-analog conversion (DAC) images, as illustrated in the signal waveforms 300, 305, 310, 315 of FIG. 3. This results in the so-called DAC images 320 that are separated by the sample frequency in RF output spectrum. Such DAC images may violate power spectral density (PSD) requirements, or in-device co-existence requirements. In conventional RF transmitters, an analog low-pass filter is typically employed immediately after the DAC in order to attenuate the DAC images. However, in digital RF transmitters, there is no such analog baseband filtering capabilities. Therefore it is important to mitigate the effect of DAC images (for example by attenuation through an RF filter) in order to prevent or minimize any PSD violation at a reasonable cost.

Thus, a need exists for an improved RF transmitter, and method of operation therefore.

SUMMARY

Accordingly, the invention seeks to mitigate, alleviate or eliminate one or more of the above mentioned disadvantages singly or in any combination. Aspects of the invention provide a method for generating a radio frequency signal for transmission over a radio frequency interface.

According to a first aspect of the invention, there is provided a radio frequency (RF) transmitter comprising a power amplifier comprising a plurality of power amplifier cells; at least one digital signal processing module operably coupled to the power amplifier. The at least one digital signal processing module comprises at least one digital pre-distortion component arranged to apply at least one digital pre-distortion codeword to the plurality of power amplifier cells, wherein the at least one digital pre-distortion codeword is applied to at least one of the plurality of power amplifier cells via a digital filter; and a combiner arranged to combine outputs of the plurality of power amplifier cells thereby generating an analogue RF signal for transmission over an RF interface based at least partly on the digitally filtered at least one digital pre-distortion codeword.

Thus, in this manner, the RF transmitter provides a multiple-fold (e.g. a 2-fold) linear interpolation digital power amplifier (DPA), whereby a digital filter is applied on a different phase to the (direct) DPA before the digital signal enters the analog domain. In this manner, by careful control/selection of the digital filter, power digital-to-analog (DAC) images may be further attenuated.

According to an optional feature of the invention, the digital filter may be a hybrid poly-phase filter.

According to an optional feature of the invention, the at least one digital pre-distortion codeword may be applied to at least one of the plurality of power amplifier cells via a digital filter and a phase offset component.

According to an optional feature of the invention, the at least one digital pre-distortion codeword may be applied to a plurality of the plurality of power amplifier cells via a plurality of different digital filters.

According to an optional feature of the invention, the at least one digital signal processing module may be further arranged to receive at least one complex input signal comprising information to be transmitted over an RF interface, and generate the at least one digital pre-distortion codeword from the at least one complex input signal.

According to an optional feature of the invention, the at least one digital signal processing module may be further arranged to interpolate a portion of the at least one digital pre-distortion codeword, and output the portion of the at least one digital pre-distortion codeword to a portion of the at least one of the plurality of power amplifier cells.

According to an optional feature of the invention, the at least one digital signal processing module may be arranged to apply a non-interpolated portion of the at least one digital pre-distortion codeword to a first portion of the at least one of the plurality of power amplifier cells and a sign-changed version of the non-interpolated portion of the at least one digital pre-distortion codeword to a second portion of the at least one of the plurality of power amplifier cells.

According to an optional feature of the invention, the plurality of power amplifier cells may form a switch-mode power cell array of a power amplifier module.

According to an optional feature of the invention, the RF transmitter may comprise at least one from a group of: a complex (in-phase/quadrature) radio frequency digital-to-analogue converter transmitter, a digital polar transmitter, a hybrid polar transmitter, a digital out-phasing transmitter, a linear amplification using non-linear components (LINC) transmitter.

According to a second aspect of the invention, there is provided an integrated circuit device comprising a signal processing module comprising at least one digital pre-distortion component substantially according to the first aspect of the invention.

According to a third aspect of the invention, there is provided a wireless communication unit comprising a radio frequency transmitter according to the first aspect of the invention.

According to a fourth aspect of the invention, there is provided a method of generating a radio frequency signal for transmission over a radio frequency (RF) interface. The method comprises generating at least one digital pre-distortion codeword; applying the at least one digital pre-distortion codeword to a plurality of power amplifier cells of a power amplifier, wherein the at least one digital pre-distortion codeword is applied to at least one of the plurality of power amplifier cells via a digital filter; and combining outputs of the plurality of power amplifier cells thereby generating an analogue RF signal for transmission over an RF interface based at least partly on the digitally filtered at least one digital pre-distortion codeword.

According to a fifth aspect of the invention, there is provided a radio frequency (RF) transmitter comprising: a power amplifier comprising a plurality of power amplifier cells; at least one digital signal processing module operably coupled to the power amplifier and comprising at least one digital pre-distortion component arranged to: interpolate a portion of at least one digital pre-distortion codeword, and output the portion of the at least one digital pre-distortion codeword to a portion of at least one power amplifier cell of the power amplifier thereby generating an analogue RF signal for transmission over the RF interface based at least partly on the interpolated portion of the at least one digital pre-distortion codeword.

According to a sixth aspect of the invention, there is provided an integrated circuit device comprising a signal processing module comprising at least one digital pre-distortion component substantially according to the fifth aspect of the invention.

According to a seventh aspect of the invention, there is provided a wireless communication unit comprising a radio frequency transmitter according to the fifth aspect of the invention.

According to an eighth aspect of the invention, there is provided a method of generating a radio frequency signal for transmission over a radio frequency (RF) interface. The method comprises generating at least one digital pre-distortion codeword; applying the at least one digital pre-distortion codeword to a plurality of power amplifier cells of a power amplifier; interpolating a portion of the at least one digital pre-distortion codeword, and outputting the portion of the at least one digital pre-distortion codeword to a portion of at least one power amplifier cell of the power amplifier thereby generating an analogue RF signal for transmission over the RF interface based at least partly on the interpolated portion of the at least one digital pre-distortion codeword.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Like reference numerals have been included in the respective drawings to ease understanding.

DETAILED DESCRIPTION

The present invention will now be described with reference to an example of a radio frequency (RF) transmitter for use within, say, a wireless telecommunication handset and adapted in accordance with some embodiments of the present invention. However, it will be appreciated that the inventive concept described herein is not limited to specific features of the illustrated example, and may equally be implemented within alternative communication units, transmitter, integrated circuits and applications.

Figure 1:
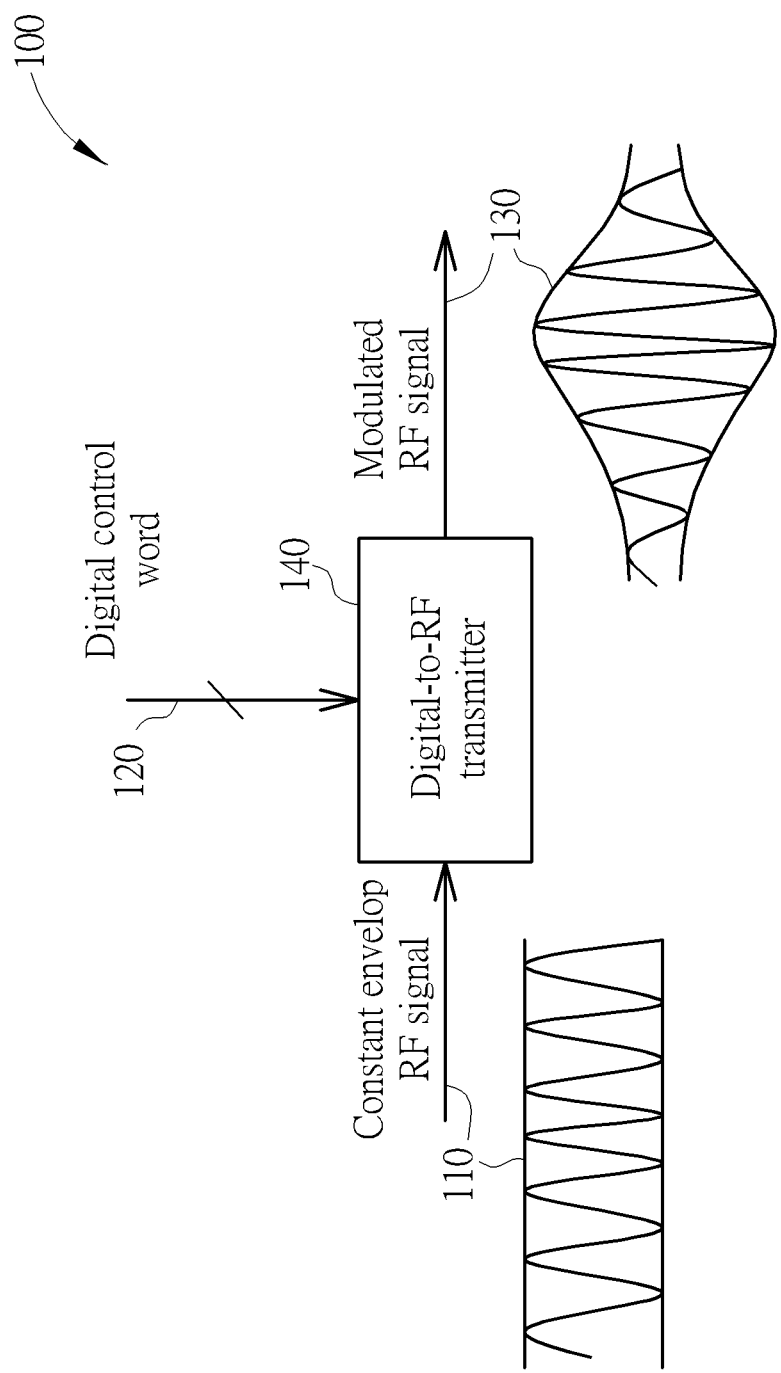
FIG. 1 illustrates a simplified overview representation of digital to radio frequency transmitters.
Figure 2:
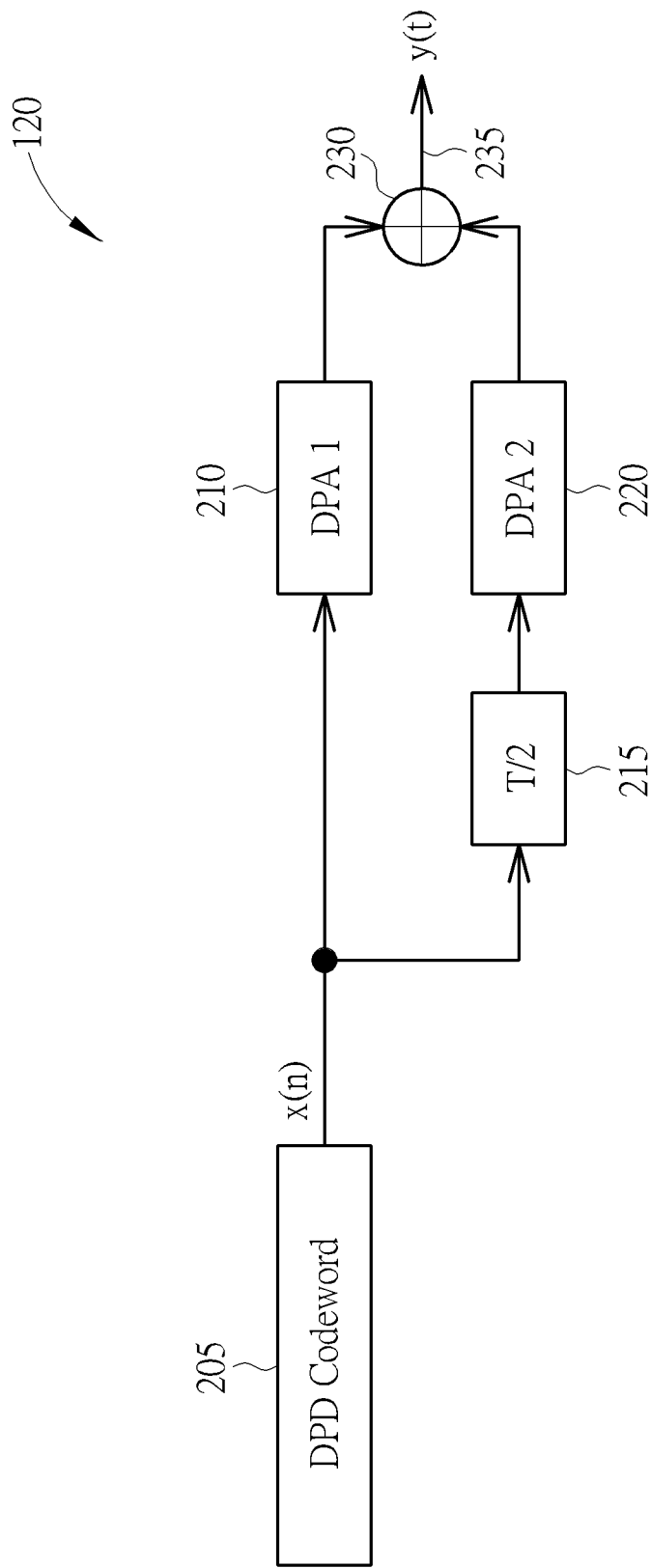
FIG. 2 illustrates a simplified block diagram of a radio frequency transmitter that uses digital predistortion codewords applied to a digital power amplifier.
Figure 3:
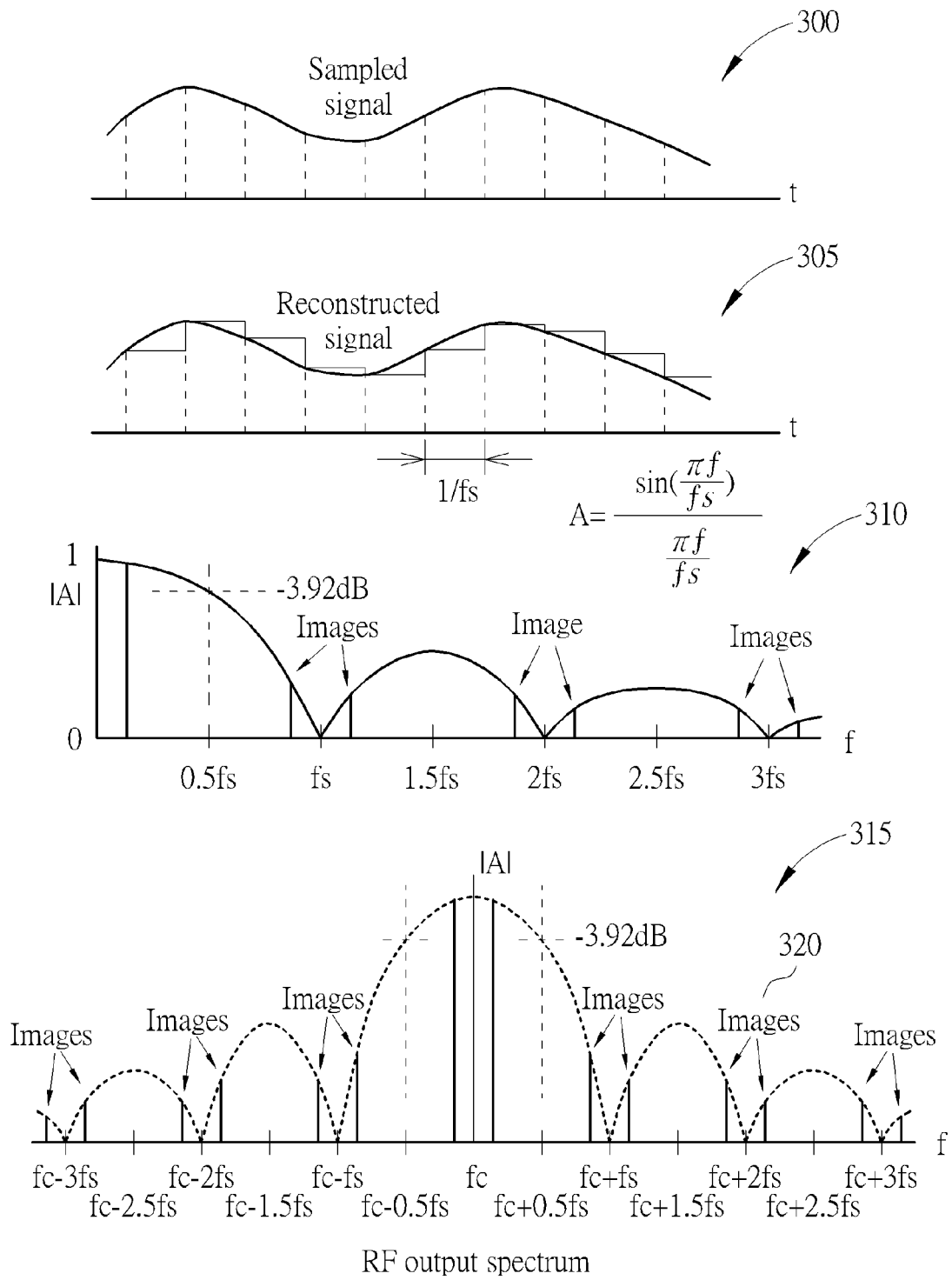
FIG. 3 illustrates an example of DAC image problems in a digital RF transmitter.
Figure 4:
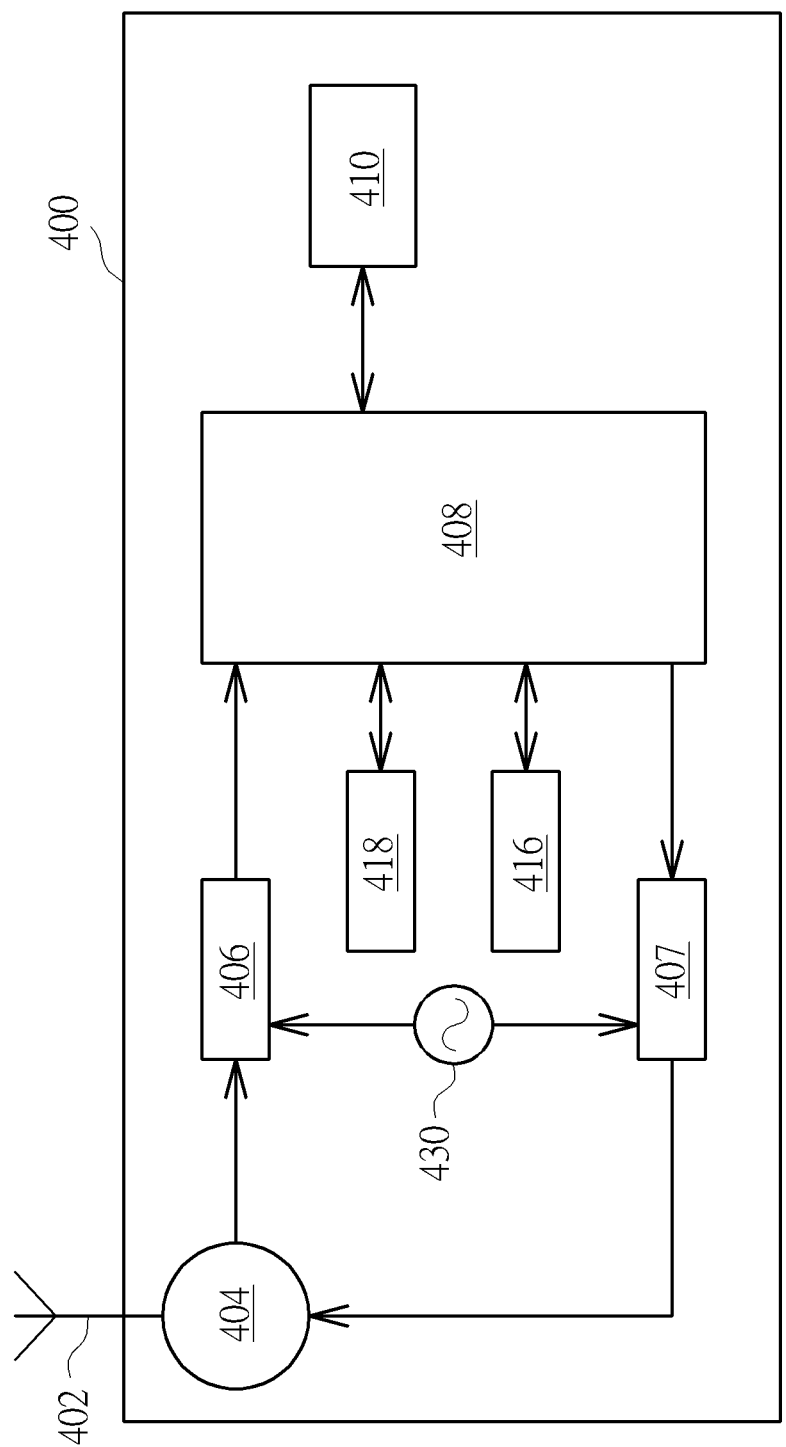
FIG. 4 illustrates a simplified block diagram of a wireless communication unit capable of implementing some examples of the present invention.

Referring first to FIG. 4, there is illustrated an example of a simplified block diagram of part of an electronic device 400 adapted to support the inventive concept of an example of the present invention. The electronic device 400, in the context of the illustrated embodiment of the invention, is a wireless telecommunication handset. As such, the electronic device 400 comprises an antenna 402 and contains a variety of well-known radio frequency transceiver components or circuits operably coupled to the antenna 402. In particular for the illustrated example, the antenna 402 is operably coupled to a duplex filter or antenna switch 404 that provides isolation between a receiver chain 406 and a transmitter chain 407. As is known in the art, the receiver chain 406 typically includes radio frequency receiver circuitry for providing reception, filtering and intermediate or base-band frequency down-conversion. Conversely, the transmitter chain 407 typically includes radio frequency transmitter circuitry for providing modulation up-conversion, amplification and filtering circuitry. Up-conversion and down-conversion circuitry receive radio frequency local oscillator signal from frequency generation circuit 430.

For completeness, the electronic device 400 further comprises signal processing logic 408. An output from the signal processing logic 408 may be provided to a suitable user interface (UI) 410 comprising, for example, a display, keypad, microphone, speaker etc. The signal processing logic 408 may also be coupled to a memory element 416 that stores operating regimes, such as decoding/encoding functions and the like and may be realised in a variety of technologies, such as random access memory (RAM), read only memory (ROM), Flash memory or any combination of these or other memory technologies. A timer 418 is typically coupled to the signal processing logic 408 to control the timing of operations within the electronic device 400.

As is well known in the art, the transmitter chain 407 of such a wireless telecommunication handset comprises transmitter circuitry arranged to receive an input signal, for example from, in the illustrated example, the signal processing logic 408; the input signal comprising information to be transmitted over an RF interface. The transmitter chain 407 is further arranged to output an RF signal comprising the information to be transmitted to, in the illustrated example, the antenna 402 via the antenna switch 404. As such, the transmitter chain 407 may be required to perform digital to analogue conversion, mixing, noise shaping and amplification of the input signal in order to generate the RF signal output thereby. In some examples, the digital signal processor of the transmitter chain 407 uses a digital predistortion codeword applied to a digital power amplifier, as described in greater detail with reference to subsequent figures.

Figure 5:
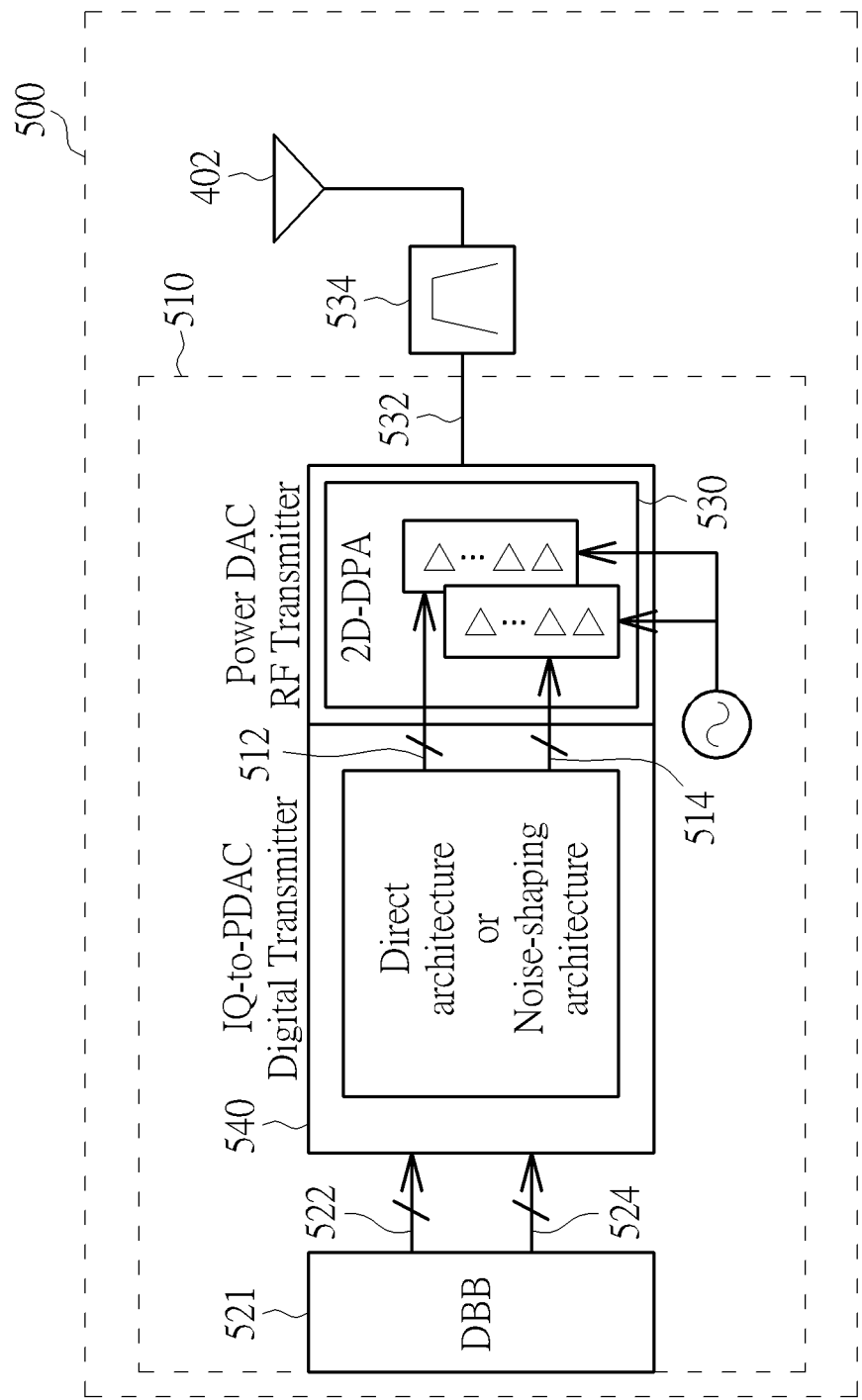
FIG. 5 illustrates a simplified example of a radio frequency transmitter capable of implementing some examples of the present invention.

Referring now to FIG. 5, there is illustrated an example of an RF transmitter 500 adapted in accordance with some example embodiments of the present invention, such as may be implemented within the transmitter chain 407 of FIG. 4. The RF transmitter 500 of FIG. 5 comprises a digital signal processing module 510 arranged to receive one or more complex input signals comprising information to be transmitted over an RF interface, for example via antenna 402 of FIG. 4. In the illustrated example, the digital signal processing module 510 is arranged to receive from a digital baseband (DBB) component 521 (such as the signal processing logic 408 of FIG. 4) an IQ (In-phase/Quadrature) input signal comprising a first (In-phase) signal component 522 and a second (Quadrature) signal component 524. The digital signal processing module 510 is further arranged to convert (e.g. perform mapping of) the received complex input signal(s) 522, 524 to a first, in-phase, digital codeword 512 and a second, quadrature, digital codeword 514, and to output the in-phase and quadrature digital codewords to power amplifier module (2D-DPA) 530 (which serves as a power DAC (PDAC)) through an IQ-to-PDAC module 540.

The power amplifier module 530 may comprise a first (in-phase) array of switch-mode power cells and, in the illustrated example, a second (quadrature) array of switch-mode power cells. The power amplifier module 530 is arranged to receive the digital codewords output by the digital signal processing module 510, and to generate an analogue RF signal 532 for transmission over an RF interface, for example via bandpass filter 534 and antenna 402, based at least partly on the received in-phase and quadrature digital codewords.

Accordingly, the digital signal processing module 510 is arranged to convert (e.g. perform mapping of) the input signals 522, 524 to the digital codewords 512, 514. The digital codewords 512, 514 are mixed with the RF signal directly in PA module 530 (comprising high-power digital-to-analogue conversion (DAC) of the RF signal) to produce an output waveform that is an RF modulated signal.

In this manner, the RF transmitter 500 comprises a complex-signal based architecture, for example an IQ based architecture, and as such is suitable for both narrowband and wideband modulation input signals. This is in contrast to, for example, a digital polar architecture which is only suitable for narrowband modulated signals due to the inherent bandwidth expansion characteristics of the AM (amplitude modulation) and PM (phase modulation) input signals of a polar architecture. Furthermore, such an I-Q based architecture avoids the need for implementing complex algorithms, such as the CORDIC algorithm typically required for digital polar architectures. In addition, the RF transmitter 500 also extends the digital domain through to the power amplifier module 530, thereby benefiting from the scalability and efficiency of digital components to a greater extent than conventional RF architectures.

Although the example of FIG. 5 is shown as comprising, say, a discrete integrated circuit comprising, at least, the signal processing module 510 that can be operably coupled to a distinct power amplifier module 530, it is envisaged in other examples that an integrated circuit may comprise the functionality of at least both the signal processing module 510 and the power amplifier module 530.

Figure 6:
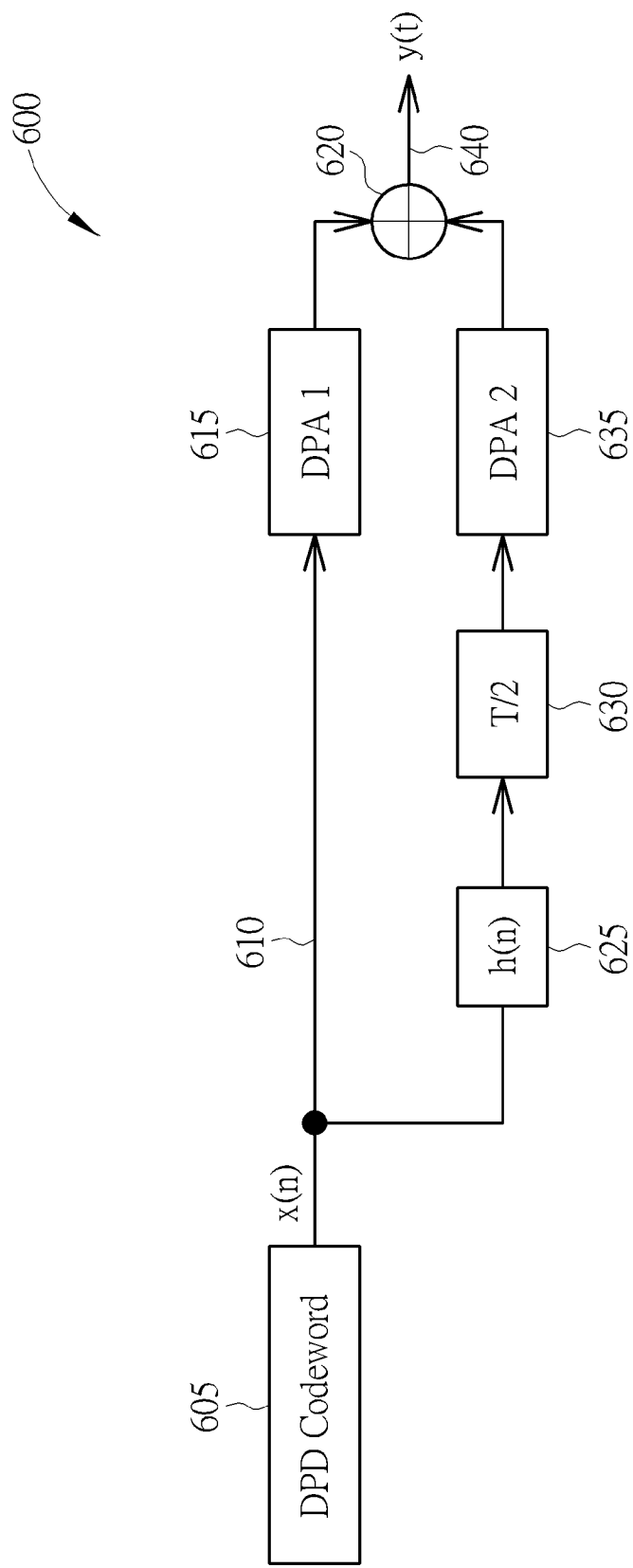
FIG. 6 illustrates a simplified block diagram of a radio frequency transmitter that uses a digital predistortion codeword applied to a hybrid poly-phase filter and a digital power amplifier according to some examples of the present invention.

Referring now to FIG. 6 there is illustrated a simplified block diagram 600 of a radio frequency transmitter that applies a digital predistortion codeword 605 to a hybrid poly-phase filter 625 according to some examples of the present invention, for example as may be implemented within the digital signal processing module 408 of FIG. 4. In other examples, the hybrid poly-phase filter (h(n)) 625 may be replaced by a filter that employs either a simple scalar gain factor or complex filtering coefficients. In some examples, the digital predistortion codeword 605 may be generated by a signal processor using a complex (IQ) input signal received, say, from a digital baseband component (not shown) and converted (e.g. perform mapping of) to the digital predistortion codeword 605. The digital predistortion codeword 605 may be applied direct 610 to a first digital power amplifier (DPA 1) 615 (for example a portion of PA module 530 of FIG. 5 (comprising high-power digital-to-analogue conversion (DAC) of the RF signal). The digital predistortion codeword 605 may also be applied to a second digital power amplifier (DPA 2) 635 via a hybrid poly-phase filter 625 and a delay element 630 to introduce a phase offset into the signal path, which in some examples may be equivalent to T/2, where T=1/fs, and where fs is the sampling frequency of the codeword sequence x(n). In some examples, the hybrid poly-phase filter 625 may be located on a path that is not the delay element 630. In some examples, a delay may be introduced on both paths, where they are, for example, offset by T/2. In some examples, the digital filtering by hybrid poly-phase filter 625 is performed at sampling frequency fs. In other examples, the phase offset introduced by the delay element 630 may be implemented in any suitable manner, e.g. an alternative hardware component, or via software or via firmware. Hence, in this manner, there is no increase in digital clock frequency for the digital codewords.

The outputs from the first digital power amplifier 615 and second digital power amplifier 635 are combined in combiner 620 and output 640 to an antenna (not shown). Notably, as the simplified block diagram 600 of a radio frequency transmitter is a digital RF transmitter, there is no analog baseband filtering.

In this manner, in accordance with the example embodiment of FIG. 6, the radio frequency transmitters provide a 2-fold linear interpolation DPA, whereby a digital filter is applied on a different phase to the (direct) DPA before the digital signal enters the analog domain. In this manner, by careful control/selection of the hybrid poly-phase filter 625 and delay element 630, all power DAC images residing at odd multiples of fs may be further attenuated. Thus, when the hybrid poly-phase filter 625 illustrated in equation [1] is applied on the second phase, the DAC images residing at odd multiples of fs are found to be substantially reduced and in some instances negligible.

$$h(n) = \begin{cases} 1/2, & n = -1 \\ 1/2, & n = 0 \\ 0, & n \neq -1, 0 \end{cases} \quad [1]$$

Thus, in some examples the coefficients on each delayed path (i.e., h(n)) together with the delay element 630 function as a poly-phase filter. The resulting transfer function (from input x(n) to output y(t)) thus contains a poly-phase filtering function. In some examples, one benefit of such an architecture is that the poly-phase filtering effect can be achieved without a commensurate increase operation clock frequency. In some examples, this may provide a significant advantage where the technology may be limited physically when supporting a particular clock frequency and/or where the power consumption is normally higher for a high operation frequency. In some examples, the delay element 630 when applied to different paths is normally equally separated. In other examples, however, this may not be necessarily always the case. Conventionally, poly-phase filters are implemented purely in digital domain, whereas notably in example embodiments of the invention the a poly-phase filter is implemented in a hybrid way, for example by separating digital streams in different paths and then combining in an RF/analog domain in order to fulfill a poly-phase filtering function.

Although the filter implementation has been described with reference to a hybrid poly-phase filter, it is envisaged that in other implementations, other filter techniques may be used, in order to substantially suppress DAC images at odd multiples of fs.

The hybrid poly-phase filter functions almost like a purely digital poly-phase filter with an input sampling frequency fs and an output sampling frequency 2fs. By carefully designing h(n), such as the one example given in equation [1], the transfer function from x(n) to y(t) can attenuate DAC images at all odd multiples of fs. This behaviour is very similar to the pure digital poly-phase filter with an output sampling 2fs just mentioned, since DAC images in this pure digital approach can only be observed at multiples of 2fs because in this case only one DPA is used and its input codeword is at sampling frequency 2fs, i.e., no DAC images at odd multiples of fs. In some examples, one benefit of using hybrid poly-phase filter is that the sampling frequency of input codeword to each of the two DPAs is fs, rather than a single DPA with an input codeword at sampling frequency 2fs.

Figure 7:
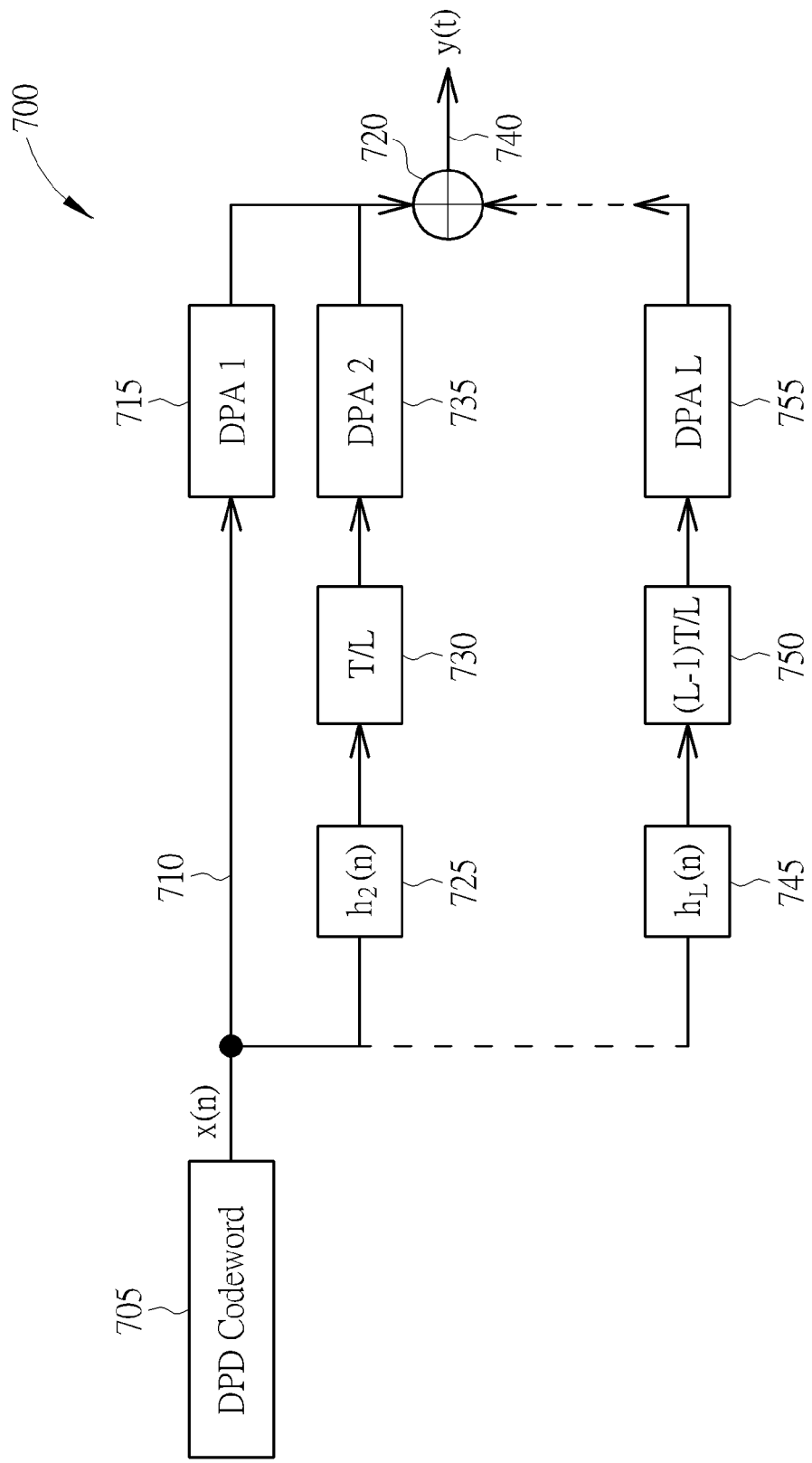
FIG. 7 illustrates a simplified block diagram of a radio frequency transmitter that uses a digital predistortion codeword applied to multiple hybrid poly-phase filters and digital power amplifiers according to some examples of the present invention.

Similarly, referring now to FIG. 7 there is illustrated a simplified block diagram of a radio frequency transmitter 700 that applies a digital predistortion codeword 705 to multiple phases using a multiple hybrid poly-phase filter arrangement, according to some examples of the present invention, for example as may be implemented within the digital signal processing module 408 of FIG. 4. In some examples, the digital predistortion codeword 705 may receive from a digital baseband component (not shown) a complex (IQ) input signal and perform mapping of the received complex input signal to digital predistortion codeword 705. The digital predistortion codeword 705 may be applied direct 710 to a first digital power amplifier (DPA 1) 715 (for example a portion of PA module 530 of FIG. 5 (comprising high-power digital-to-analogue conversion (DAC) of the RF signal).

As shown, the digital predistortion codeword 705 may also be applied to multiple digital power amplifiers (DPA 2, DPA L) 735, 755 via multiple hybrid poly-phase filters 725, 745 and corresponding multiple delay elements 730, 750 to introduce multiple respective phase offsets into the multiple respective signal paths. Thus, in one example, the 2-phase implementation of FIG. 6 may be replaced with a multiple-phase (L-phase) implementation. In this manner, the hybrid poly-phase filter is arranged to function almost like a purely digital poly-phase filter, with an input sampling frequency fs and an output sampling frequency Lfs. By carefully designing $h_2(n), \ldots, h_L(n)$, the transfer function from x(n) to y(t) may be arranged to attenuate DAC images at almost all multiples of fs, except multiples of Lfs. This behaviour is very similar to the pure digital poly-phase filter with an output sampling Lfs (as mentioned above), since DAC images in this pure digital approach can only be observed at multiples of Lfs because in this case only one DPA is used and its input codeword is at sampling frequency Lfs, i.e., no DAC images at fs, 2fs, ... (L−1)fs, (L+1)fs, (L+2)fs, ... (L+L−1)fs, etc.

In some examples, the phase offsets may be equivalent to T/L, where T=1/fs (where fs is the sampling frequency of the codeword sequence x(n)) and L is the number of different paths (and filtered phase signals) employed.

The outputs from the first digital power amplifier 715, second digital power amplifier 735, and multiple digital power amplifiers to $L^{th}$ digital power amplifier 755 are combined in combiner 720 and output 740 to an antenna (not shown).

The multiple hybrid poly-phase filters may resemble an implementation of digital poly-phase filters that are effected purely in digital domain. However, a purely digital poly-phase filter with L phases would require the clock frequency for the final digital codeword to be Lfs. In contrast, and notably, the clock frequency for the digital codewords in the example embodiments is maintained at fs. Nevertheless, in the example embodiment of FIG. 7, there are L digital streams input into the DPAs. The combining of these L digital streams is performed in both the DPAs 715, 735, 755 and combining network 720 rather than in digital domain.

In this manner, in accordance with the example embodiments of FIG. 6 and FIG. 7, the radio frequency transmitters provide an L-fold linear interpolation DPA, whereby multiple digital filters are applied on multiple different phases to the DPA before the digital signal enters the analog domain. In this manner, by careful control/selection of the hybrid poly-phase filters 725 . . . 745 and delay elements 730 . . . 750, all power DAC images residing at odd multiples of fs may be even further attenuated.

Figure 8:
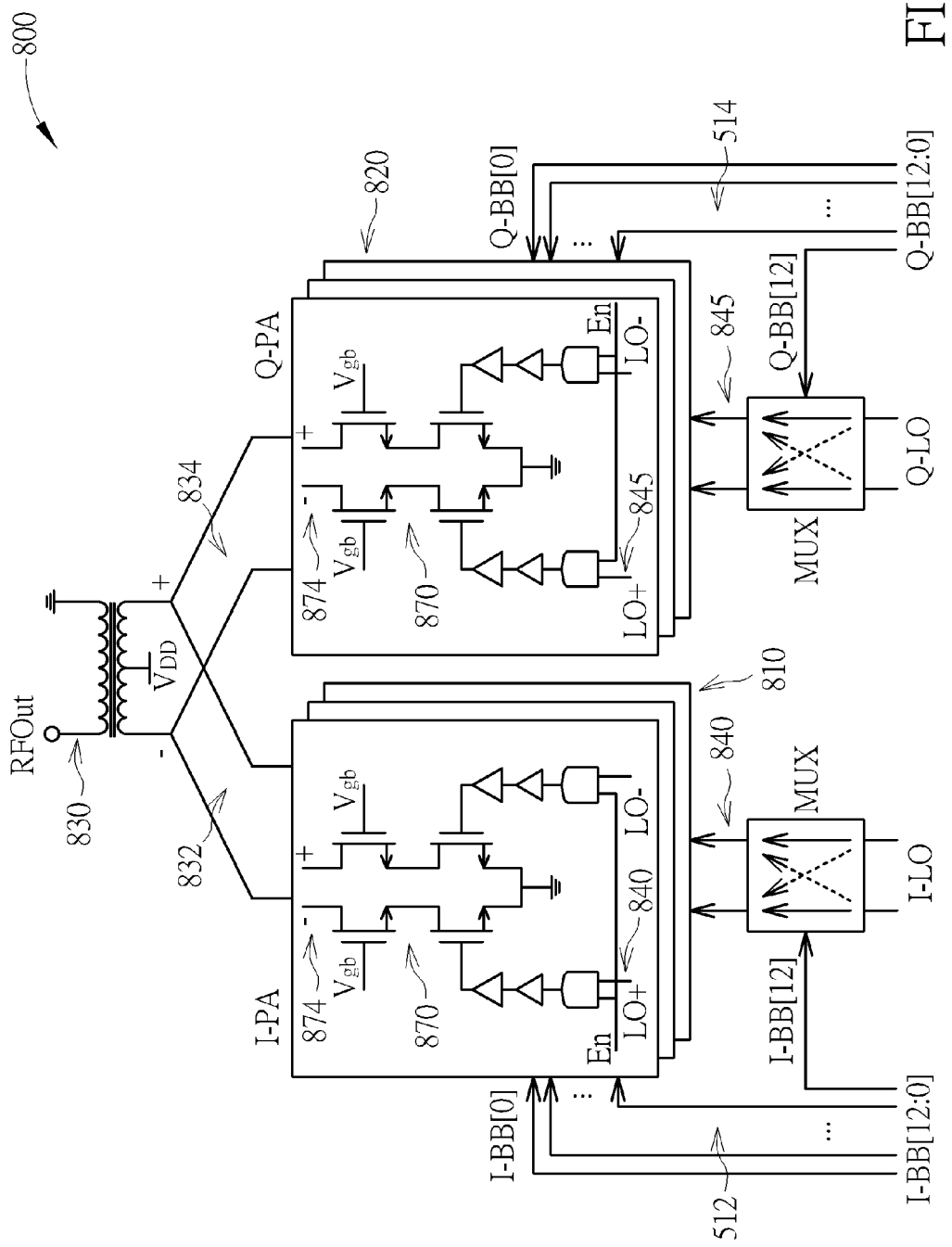
FIG. 8 illustrates a simplified circuit diagram of a radio frequency transmitter that uses a digital predistortion codewords applied to a digital power amplifier according to some examples of the present invention.

Referring now to FIG. 8, there is illustrated a simplified diagram 800 of an example of the power amplifier module 530 of FIG. 5. The power amplifier module 530 is arranged to receive quadrature digital codewords output by the digital signal processing module, and to output an analogue RF signal 830 for transmission over an RF interface, for example via the antenna 402 of FIG. 4, based at least partly on the received quadrature digital codeword (I-BB[12:0], Q-BB[12:0]) 512, 514. The power amplifier module 530 comprises a first array (I-PA) 810 of 'I' switch-mode power cells 870 and, in the illustrated example, a second array (Q-PA) 820 of 'Q' switch-mode power cells 870. The first array 810 of 'I' switch-mode power cells 870 is arranged to receive at least a part of the first (e.g. in-phase) digital codeword 512 and to generate a first (e.g. in-phase) component 832 of the analogue RF signal 830 based at least partly on the received digital codeword 512. Conversely, the second array 820 of switch-mode power cells 870 is arranged to receive at least a part of the second (e.g. quadrature) digital codeword 514 and to generate a second (e.g. quadrature) component 834 of the analogue RF signal 830 based at least partly on the received digital codeword 514. The separate components 832, 834 are subsequently combined to generate the complex analogue RF signal 830.

In this manner, by providing multiple switch-mode power cell arrays 810, 820 arranged to receive separately the digital codewords 512, 514 for the respective components of a multi-dimensional, e.g. complex (IQ), signal, and to separately generate the amplified components 832, 834 therefore (which may then be subsequently combined), a power amplifier module 530 is achieved that is capable of being digitally controlled to generate a multi-dimensional (e.g. IQ) amplified signal.

For some example embodiments, each of the arrays 810, 820 of switch-mode power cells 870 may be arranged to receive at least a part of the respective digital codeword 512, 514 comprising, say, N control bits. Furthermore, each of the arrays 810, 820 of switch-mode power cells 870 may comprise N switch-mode power cells; each of the switch-mode power cells 870 being arranged to selectively output a current signal ($I_{out}$) 874 based on the value of, say, a received control bit. The outputs of the switch-mode power cells 870 within each array 810, 820 are operably coupled together, such that the individual power cell output current signals ($I_{out}$) 874 are combined to provide the respective component 832, 834 of the analogue RF signal 830. In some examples, the output current signal ($I_{out}$) 874 for the individual switch-mode power cells 870 within each array 810, 820 may be weighted in accordance with the significance of their respective control bits. In this manner, the combined output current signal of each array 810, 820 may be representative of the value of the digital codeword received thereby.

Advantageously, the power amplifier module 530 illustrated in FIG. 8 enables digital to analogue conversion functionality to be combined with power amplifier functionality, thereby simplifying the RF transmitter design. Furthermore, the provision of separate switch-mode power cell arrays 810, 820 to support the separate I and Q components of the complex IQ input signal enables the power amplifier module 530 to be suitable for both narrowband and wideband modulation input signals.

The switch-mode power cell arrays 810, 820 of the power amplifier module 530 illustrated in FIG. 8 are further arranged to receive respective carrier frequency signals 840, 845, and to generate the respective components 832, 834 of the analogue RF signal 830 further based at least partly on the received carrier frequency signals 840, 845. For example, the respective carrier frequency signal 840, 845 may be provided to each individual switch-mode power cell 870, such as illustrated at 840 within the illustrated power cell 870. Thus, a two-phase selection may be realized in the analogue domain, whereby two sets of LO may be generated based on the value of sign-bit I-BB[12] (or sign-bit Q-BB [12]). Together with the amplitude bits I-BB[11:0] (or Q-BB [11:0]) to turn 'on' and 'off' the power cells in switch-mode power cell array 810 (or switch-mode power cell array 820), the power amplifier module 530 illustrated in FIG. 8 may enable mixing functionality to also be combined with either/both the power amplifier functionality and digital to analogue conversion functionality. The routing of these two sets of LO may consume a significant amount of power and occupy a corresponding increase in silicon area. In this manner, the power amplifier module 530 illustrated in FIG. 8 enables mixing functionality to also be combined with the power amplifier functionality and digital to analogue conversion functionality.

In alternative examples, in contrast to the illustrated two-phase selection implemented in the analog domain, whereby two sets of LO are generated based on the value of a sign bit, multiple phase selections may be implemented whereby multiple sets of LO may be generated based on one or more phase selection bits.

Advantageously, because the digital domain extends through to the power amplifier module 530, there is no need for a linear pre-driver amplifier or baseband filter. Furthermore, the use of digitally controlled power cells enables the power consumption of the power amplifier module 530 to be scalable to substantially instantaneous RF output power.

Figure 9:
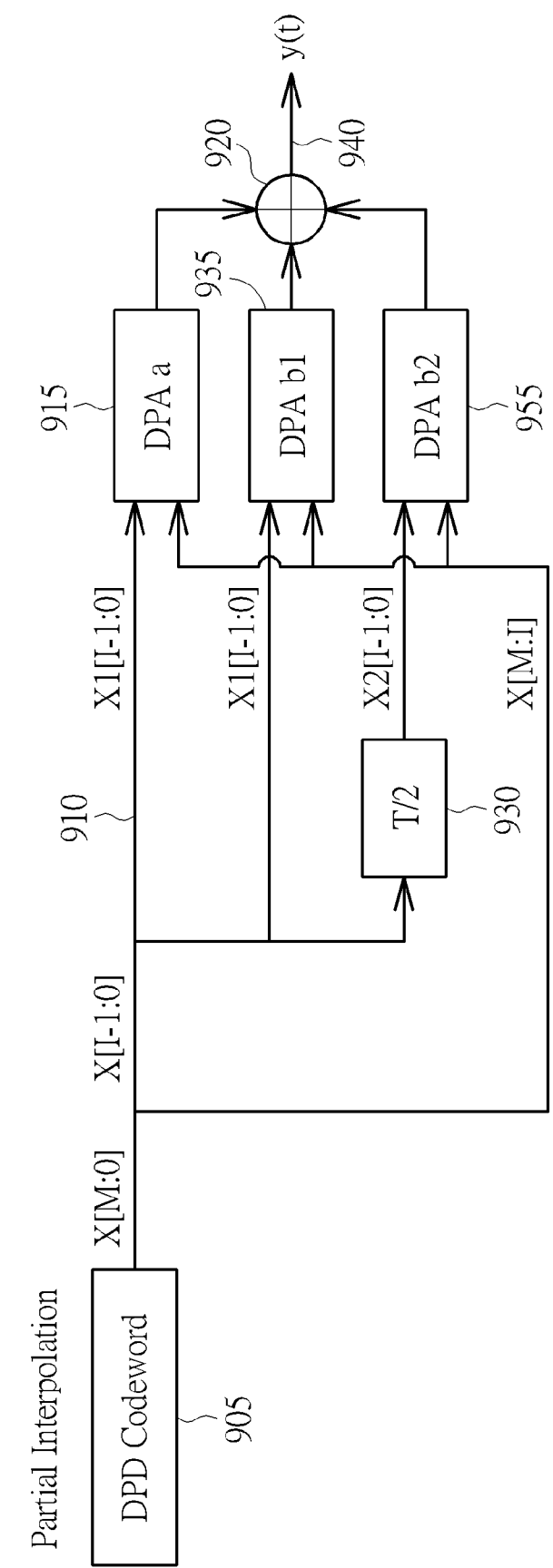
FIG. 9 illustrates a simplified block diagram of a radio frequency transmitter that uses a digital predistortion codeword applied via partial interpolation to a digital power amplifier according to some examples of the present invention.

FIG. 9 illustrates a simplified block diagram of a radio frequency transmitter 900 that uses a digital predistortion codeword 905 applied via partial interpolation to a digital power amplifier, according to some examples of the present invention, for example as may be implemented within the digital signal processing module 408 of FIG. 4.

In some examples, the digital predistortion codeword 905 may receive from a digital baseband component (not shown) a complex (IQ) input signal and convert (e.g. perform mapping of) the received complex input signal to a digital predistortion (DPD) codeword 905.

In one example, only a portion of the PA power cells is interpolated, i.e. the bit stream is first split into several paths with different delays and then combined. Thus, in the partial interpolation arrangement example of FIG. 9, the DPA is firstly divided into two parts, 'DPA a' 915 and 'DPA b1' 935, 'DPA b2' 955, (for example respective portions of PA module 530 of FIG. 5 (comprising high-power digital-to-analogue conversion (DAC) (not shown) of the RF signal). In one example, there is no interpolation of the digital predistortion codeword 905 that is used with 'DPA a' 915, for example DPA (unit) 'a' receives control bits X[M:0], whilst the interpolation with 'DPA b1' 935, 'DPA b2' 955 receives two sets of control bits and is interpolated, for example it may be configured to employ either full-codeword interpolation or partial code-word interpolation.

However, not all bits are interpolated, i.e., part of the control bits X[M:0] is interpolated. In a partial codeword interpolation example, only a part of the baseband control bits, for example X[I-1:0] (out of X[M:0]), may be interpolated. Thus, a respective partial interpolation 910 of the digital predistortion codeword 905 may also be applied to multiple (two in this illustrated example) digital power amplifiers 935, 955, with a second path to the second 'DPA b2' 955 being applied via a corresponding delay element(s) 930 to introduce multiple respective phase offsets into the multiple respective signal paths. In some examples, the phase offset(s) may be arranged to be equivalent to T/2, where T=1/fs (where fs is the sampling frequency of the codeword sequence x(n)).

In a full codeword interpolation example, the baseband control bits that are input to 'DPA a' 915 and 'DPA b1' 935, 'DPA b2' 955 are X1[M:0] and X2[M:0], respectively.

In this example, the outputs from the first 'DPA a' 915 and second 'DPA b1' & 'DPA b2' 935, 955 are combined in combiner 920 and output 940 to an antenna (not shown). In other examples, second 'DPA b1' & 'DPA b2' 935, 955 may comprise multiple paths (for example 'L' paths as illustrated with respect to FIG. 7), where each path may comprise a different delay offset, say T/L.

Thus, in summary in light of the described examples herein, partial interpolation may encompass a two-fold meaning: (i) whereby part of the DPA units can be controlled by interpolated bits, and (ii) whereby partial interpolation may be applied to just part of the control bits.

In this manner, a partial interpolation arrangement may reduce a level of DAC images, as well as reduce circuit complexity and power consumption at a potential expense of minimal performance degradation. A general purpose of using interpolation is to keep a clock frequency low. Therefore, and advantageously, although each path may have a different clock delay, each path operates with the same clock frequency and there is no overall increase in digital clock frequency.

Figure 10:
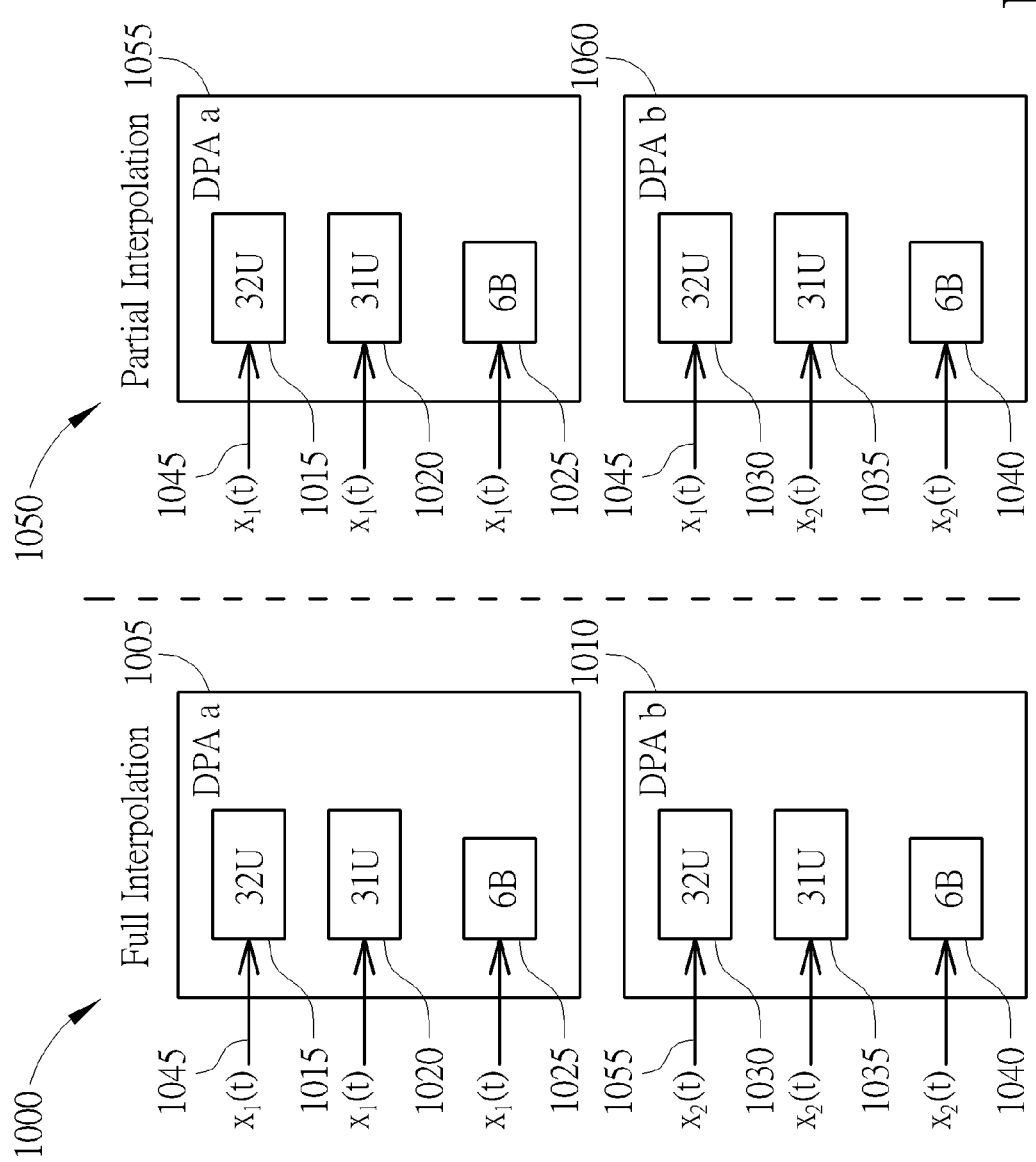
FIG. 10 illustrates a simplified block diagram of a radio frequency transmitter that uses a digital predistortion codeword applied via full interpolation to a digital power amplifier according to some examples of the present invention.

Referring now to FIG. 10, a simplified block diagram of an RF transmitter is illustrated that compares using a DPD codeword applied via full interpolation 1000 or via partial interpolation 1050 to a DPA, according to some examples of the present invention. In this example, the DPA is arranged to comprise 32 unary cells 1015, 1030 (each of weight '64'), 31 unary cells 1020, 1035 (each of weight '64') and 6 binary cells 1025, 1040 (each of weight '32', '16', '8', '4', '2', '1'). As illustrated, in a first DPA (DPA a) 1005, 1055, for both partial interpolation 1050 and full interpolation 1000 the input x1(t) may be applied to each of the 32 unary cells 1015, 31 unary cells 1020, and 6 binary cells 1025. In a full interpolation 1000 implementation, the input x2(t) may be applied to each of the 32 unary cells 1030, 31 unary cells 1035 and 6 binary cells 1040 of the second DPA (DPA b) 1010.

However, in a DPA partial interpolation 1050, the top 32 unary cells 1030 are not interpolated, with the input x1(t) being re-applied to each of the 32 unary cells 1030. Here, the input x2(t) is applied to each of the 31 unary cells 1035 and 6 binary cells 1040 of the second DPA (DPA b) 1060.

In some examples, various partial interpolating techniques can be used. In one example, amplitude control bits may be interpolated. In another example, a sign-bit may be interpolated. In yet another example, any part of a control codeword may be interpolated.

Figure 11:
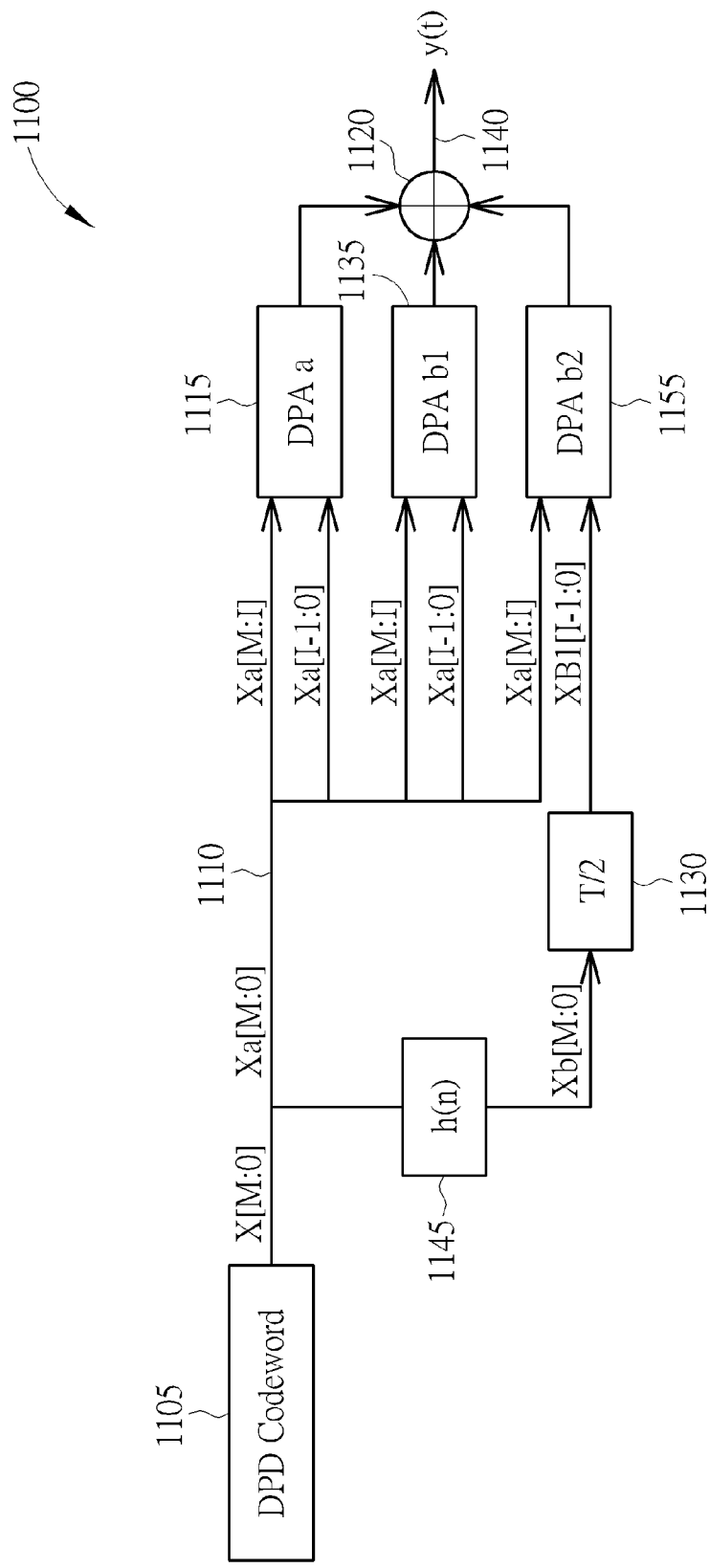
FIG. 11 illustrates a simplified block diagram of a radio frequency transmitter that uses a digital predistortion codeword applied via a hybrid poly-phase filter and partial interpolation to a digital power amplifier according to some examples of the present invention.

FIG. 11 illustrates a simplified block diagram of a radio frequency transmitter 1100 that uses both a DPD codeword 1105 applied via a hybrid poly-phase filter in addition to applying partial interpolation to a DPA according to some examples of the present invention, for example as may be implemented within the digital signal processing module 408 of FIG. 4.

In some examples, the digital predistortion codeword 1105 may receive from a digital baseband component (not shown) a complex (IQ) input signal and convert (e.g. perform mapping of) the received complex input signal to a digital predistortion (DPD) codeword 1105.

In this example, only a portion of the PA power cells is interpolated. Thus, in the partial interpolation arrangement example of FIG. 11, the DPA is firstly divided into two parts, 'DPA a' 1115 and 'DPA b1' 1135, 'DPA b2' 1155, (for example respective portions of PA module 530 of FIG. 5 (comprising high-power digital-to-analogue conversion (DAC) (not shown) of the RF signal)). In one example, there is no interpolation of the digital predistortion codeword 1105 that is used with 'DPA a' 1115, whilst the interpolation with 'DPA b1' 1135, 'DPA b2' 1155 may be configured to employ either full-codeword interpolation or partial code-word interpolation.

In a partial codeword interpolation example, only a part of the baseband control bits, for example X[I-1:0] (out of X[M:0]), may be interpolated. Thus, a respective partial interpolation 1110 of the digital predistortion codeword 1105 may also be applied to multiple (two in this illustrated example) digital power amplifiers 1135, 1155, with a second path to the second 'DPA b2' 1155 being applied via a hybrid poly-phase filter (h(n)) 1145 and a corresponding delay element(s) 1130 to introduce multiple respective phase offsets into the multiple respective signal paths. In some examples, the phase offset(s) may be arranged to be equivalent to T/2, where T=1/fs (where fs is the sampling frequency of the codeword sequence x(n)). In some examples, the filtering by hybrid poly-phase filter h(n) 625 is performed at sampling frequency fs.

In a full codeword interpolation example, the baseband control bits that are input to 'DPA a' 1115 and 'DPA b1' 1135, 'DPA b2' 1155 are X1[M:0] and X2[M:0], respectively.

The outputs from the first 'DPA a' 1115 and second 'DPA b1' 1135, 'DPA b2' 1155 are combined in combiner 1120 and output 1140 to an antenna (not shown). In other examples, second DPA b 1135, 1155 may comprise multiple paths (for example 'L' paths as illustrated with respect to FIG. 7), where each path may comprise a different delay offset, say T/L.

In this manner, by careful control/selection of the hybrid poly-phase filter 1145 and delay element 1130, all power DAC images residing at odd multiples of fs may be further attenuated. Thus, when the hybrid poly-phase filter 1145, for example according to equation [1] is applied on the second phase, the DAC images residing at odd multiples of fs are found to be substantially reduced and in some instances negligible.

In this manner, a partial interpolation arrangement may reduce a level of DAC images, as well as reduce circuit complexity and power consumption at a potential expense of minimal performance degradation. Therefore, and advantageously, although each path may have a different clock delay, each path operates with the same clock frequency and there is no overall increase in digital clock frequency.

Figure 12:
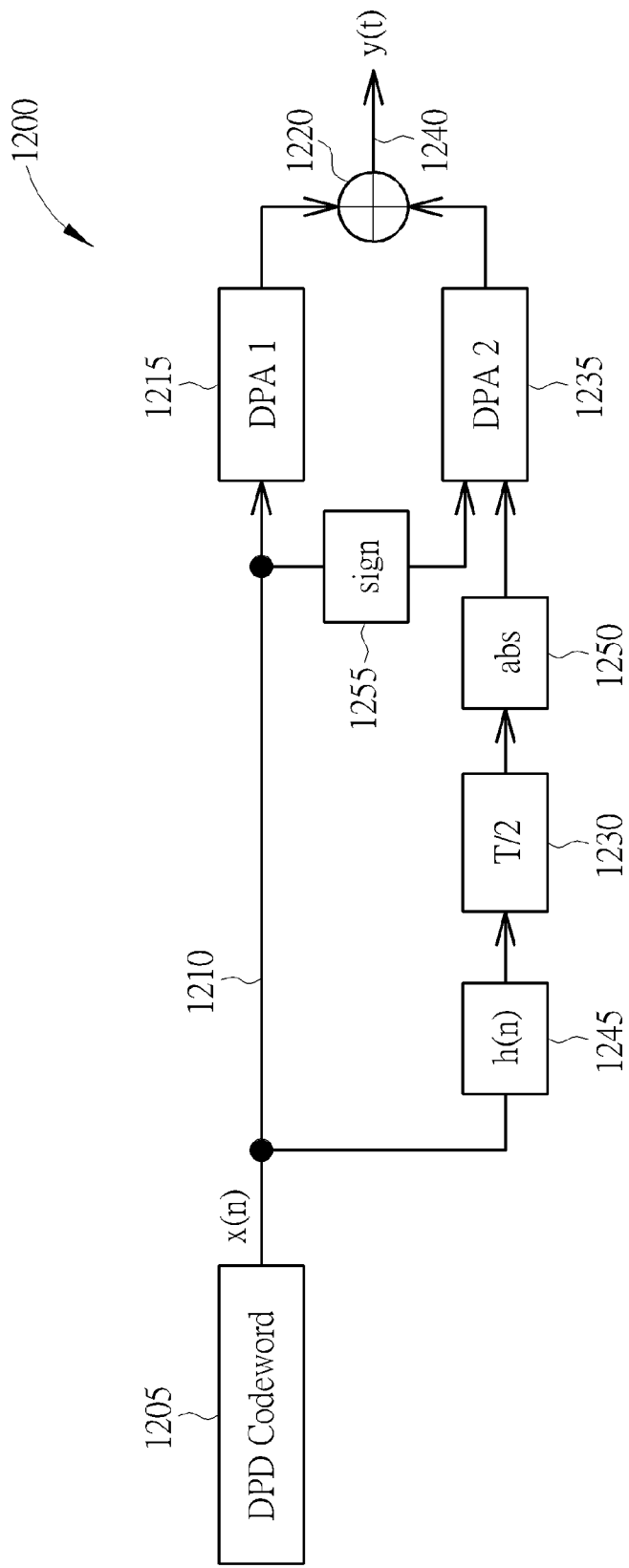
FIG. 12 illustrates an alternative simplified block diagram of a radio frequency transmitter that uses a digital predistortion codeword applied via a hybrid poly-phase filter and partial interpolation to a digital power amplifier according to some examples of the present invention.

FIG. 12 illustrates an alternative simplified block diagram of a radio frequency transmitter 1200 that uses a DPD codeword 1205 applied via a hybrid poly-phase filter (h(n)) 1245 in addition to applying partial interpolation to a digital power amplifier according to some examples of the present invention, for example as may be implemented within the digital signal processing module 408 of FIG. 4.

In some examples, the DPD codeword 1205 may receive from a digital baseband component (not shown) a complex (IQ) input signal and convert (e.g. perform mapping of) the received complex input signal to DPD codeword 1205. The DPD codeword 1205 may be applied direct 1210 to a first DPA (DPA 1) 1215 (for example a portion of PA module 530 of FIG. 5 (comprising high-power digital-to-analogue conversion (DAC) of the RF signal)). The DPD codeword 1205 may also be applied to a second DPA (DPA 2) 1235 via a sign-change function 1255 to replace the sign-bit of second path with the sign-bit of the first path. In this manner, the sign bit is not interpolated and is the same on both paths, with the rest of the signal applied to second DPA 1235 being different as it has been passed through a hybrid poly-phase filter and delay and absolute function. In this manner, the DPD codeword 1205 may also be applied to the second DPA 1235 via a hybrid poly-phase filter 1245 and a delay element 1230 to introduce a phase offset into the signal path, which in some examples may be equivalent to T/2, where T=1/fs, and where fs is the sampling frequency of the codeword sequence x(n). In some examples, the filtering by hybrid poly-phase filter 1245 is performed at sampling frequency fs. A filtered, phase-offset signal is then input to an absolute function to set an absolute value of the DPD codeword in absolute function 1250 prior to applying to the second DPA 1235.

Figure 13:
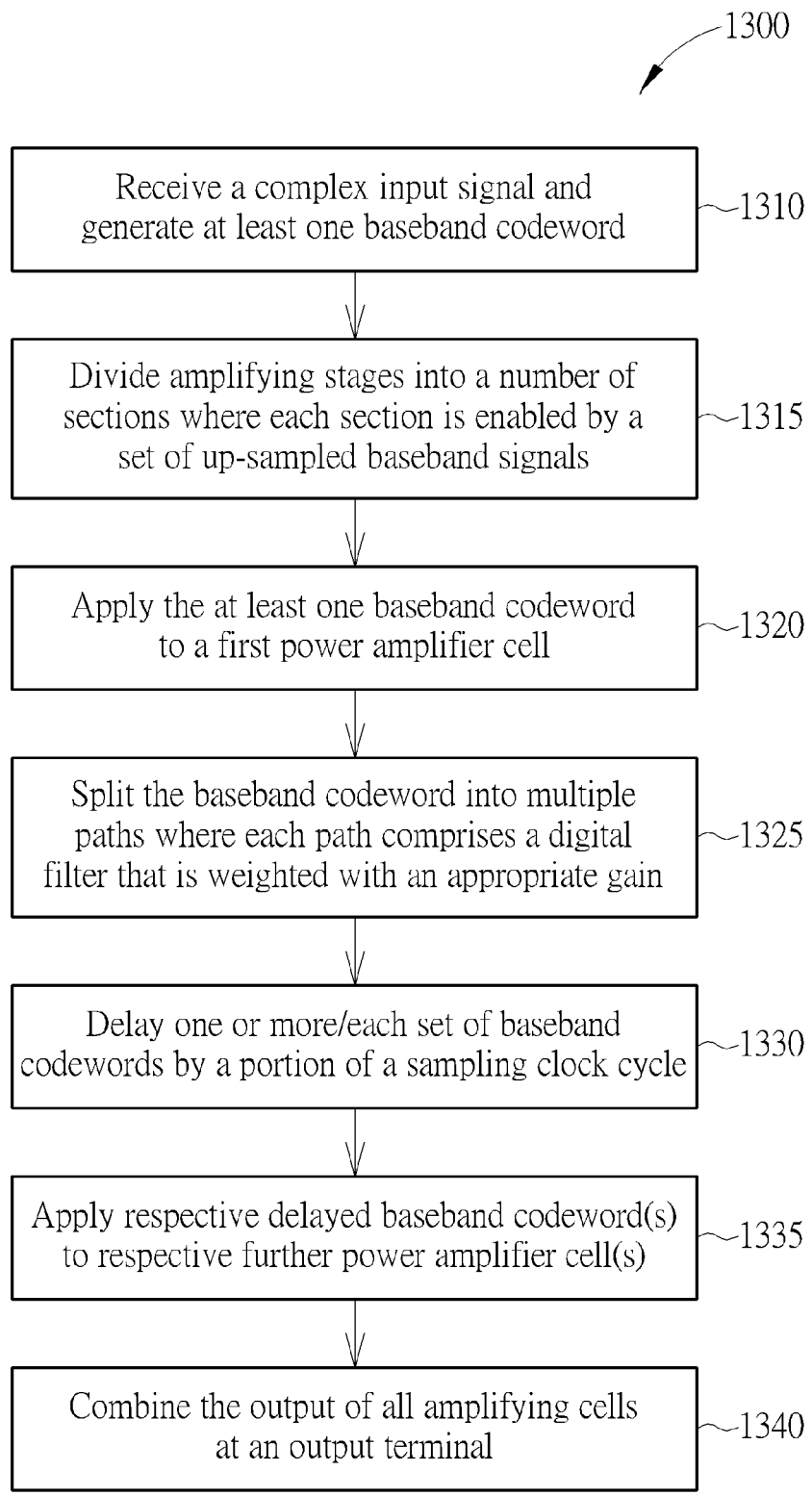
FIG. 13 illustrates a flowchart of an example use of a hybrid poly-phase filter approach to reduce the effect of DAC images.

The outputs from the first digital power amplifier 1215 and second digital power amplifier 1235 are combined in combiner 1220 and output 1240 to an antenna (not shown). Notably, as the simplified block diagram 1200 of a radio frequency transmitter is a digital RF transmitter, there is no analog baseband filtering Referring now to FIG. 13, there is illustrated a simplified flow chart 1300 for implementing digital filtering, for example hybrid poly-phase filtering, for example to reduce an effect/level of DAC images. Initially, at 1310, a complex input signal is received and at least one baseband codeword signal generated therefrom. At 1315, the amplifying stages may be divided into a number of sections, where each section may be enabled by a set of up-sampled baseband signals. At 1320, the at least one baseband codeword signal may be applied to a first power cell of a power amplifier module. Although not shown in FIG. 13, this path may pass through one or more digital filters or delay elements. At 1325, the up-sampled baseband codeword signal may also be split into/applied to multiple paths, where each path comprises a digital filter that may be weighted with an appropriate gain value. At 1330, one or more of the paths carrying the baseband codeword signal(s) may also be delayed by a portion of a sampling clock cycle. At 1335, the respective delayed, baseband, codeword signal(s) may be applied to respective further individual amplifying cells/stages. At 1340, the outputs of the amplifying cells/stages are combined at an output terminal.

Figure 14:
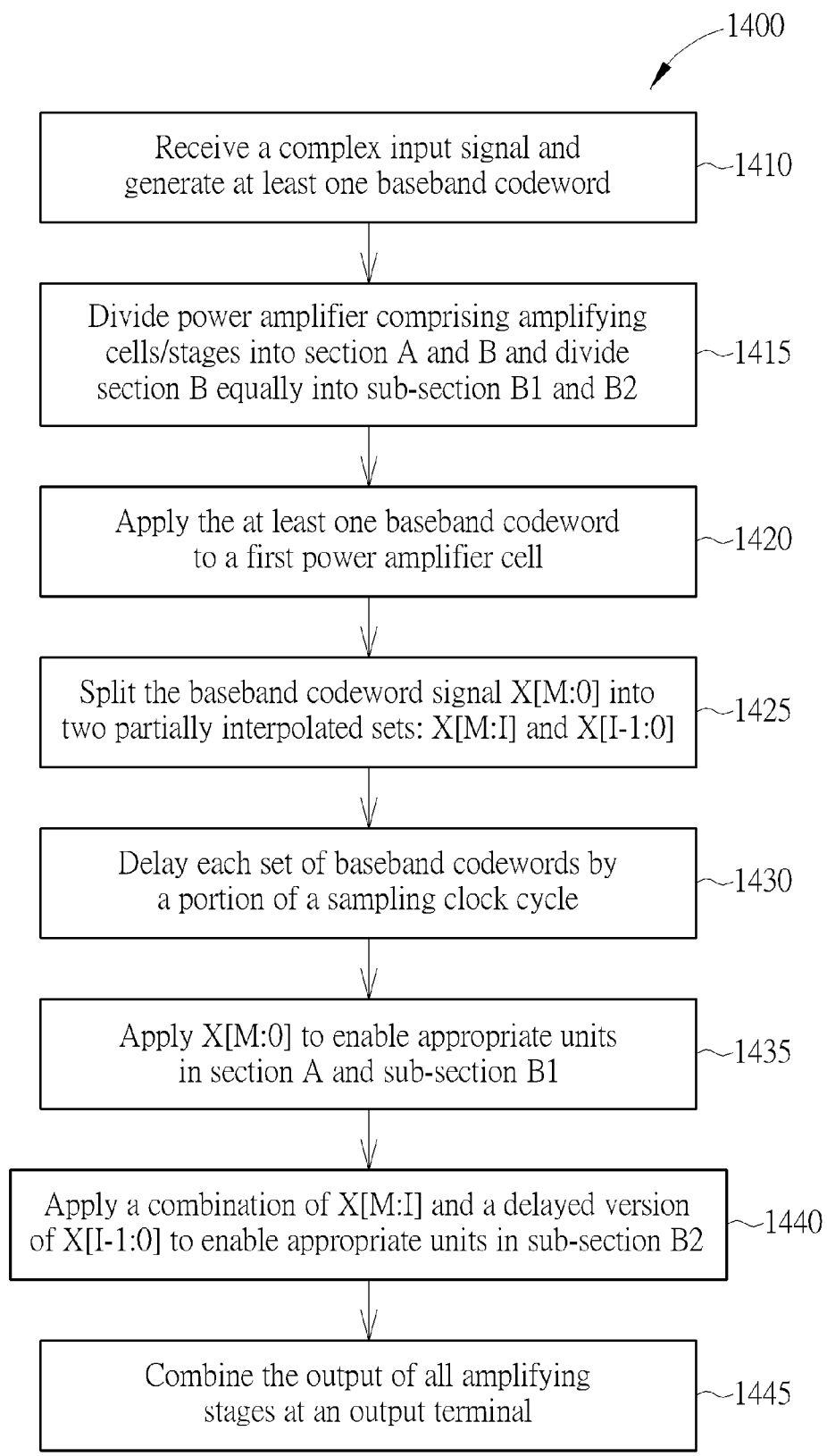
FIG. 14 illustrates a flowchart of an example use of a partial interpolation approach to reduce the effect of DAC images.

Referring now to FIG. 14, there is illustrated a simplified flow chart 1400 for implementing partial interpolation of a codeword, for example to reduce an effect/level of DAC images. Initially, at 1410, a complex input signal is received and at least one baseband codeword signal generated therefrom. At this time the signal may be enabled. At 1415, the power amplifier comprising amplifying cells/stages may be divided into a number of sections. In this example, amplifying cells/stages are divided into sections 'A' and 'B'. Further, section 'B' may be divided into sub-sections 'B1' and 'B2', wherein 'B1' and 'B2', in this example, may be equal. It should be noted that in other examples, sections of amplifying cells/stages may be divided into more than two sub-sections, and that these sub-sections may not be equal. At 1420, the baseband codeword signal X[M:0] may be split into sets. In this example at 1425, the base band signal X[M:0] may be split into two partially interpolated sets X[M:I] and X[1-:0]; however splitting into more than two sets is envisaged in other examples. However, in other examples, it is envisaged that the base band signal X[M:0] may be split into multiple paths, where one path is not interpolated and at least at least one path or multiple paths is/are interpolated, for example 'L' paths as illustrated with respect to FIG. 7), where each path may comprise a different delay offset, say T/L. At 1430, one or more paths may be delayed. At 1435, set X[M:0] may be used to enable appropriate units in section 'A' and sub-section 'B1'. At 1440, a combination of X[M:I] and a delayed version of X[1-1:0) may be used to enable appropriate units in sub-section 'B2', for example. At 1445, the outputs of the amplifying cells/stages are then combined at an output terminal.

Figure 15:
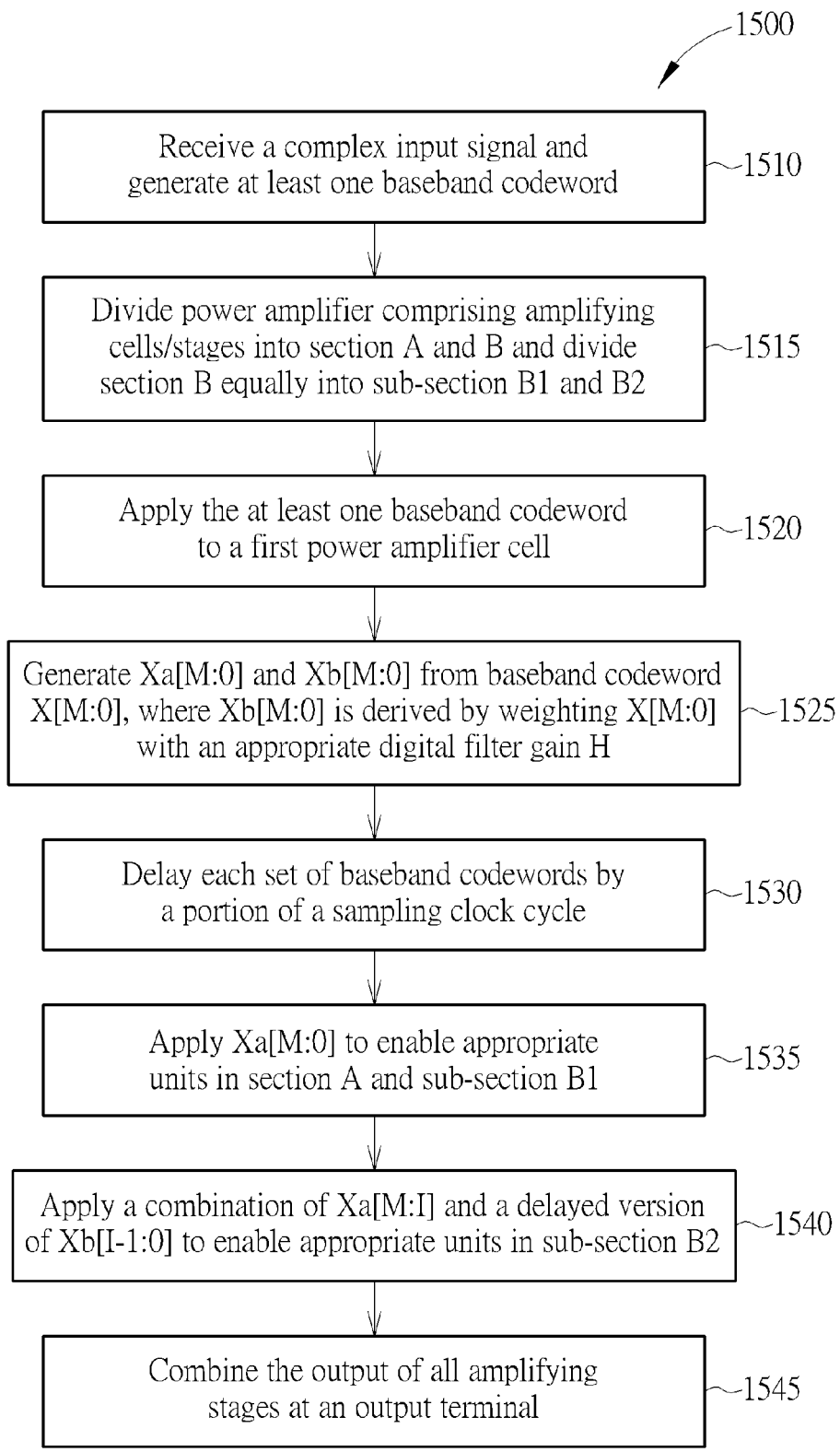
FIG. 15 illustrates a flowchart of an example use of both a hybrid poly-phase filter and a partial interpolation approach to reduce the effect of DAC images.

Referring now to FIG. 15, there is illustrated a simplified flow chart 1500 for implementing a combination of digital filtering (e.g. hybrid poly-phase filtering) and partial interpolation, for example to reduce an effect/level of DAC images. Initially, at 1510, a complex input signal is received and at least one baseband codeword signal generated therefrom. At this time the signal may be enabled. At 1515, the power amplifier comprising amplifying cells/stages may be divided into a number of sections. In this example, amplifying cells/stages are divided into two sections 'A' and 'B'. Further, in some examples, section B may be divided into sub-sections 'B1' and 'B2', wherein sub-sections 'B1' and 'B2', in this example, may be equal. It should be noted that in other examples, sections of amplifying cells/stages may be divided into more than two sub-sections, and in some examples these sub-sections may not be equal. At 1520, the at least one baseband codeword signal may be applied to a first power cell of a power amplifier module. In a two power amplifier cell implementation, the at least one baseband codeword signal may be also applied to a second power cell of a power amplifier module via a sign-change function. At 1525, Xa[M:0] and Xb[M:] for the respective power amplifier cells/stages may be generated from baseband signal X[M:0], where Xb[M:0] may be derived by weighting X[M:0] with an appropriate digital filter, for example a hybrid poly-phase filter that provides a transfer function 'H'. At 1530, one or more paths may be delayed. At 1535, Xa[M:0] may be used to enable appropriate units in section 'A' and sub-section 'B1'. Further, at 1540, a combination of Xa[M:1] and a delayed version of Xb[1-1:0] may be used to enable appropriate units in sub-section 'B2'. At 1545, the output of the amplifying cells/stages is then combined at an output terminal for applying to an antenna.

In the example illustrated in FIG. 5, the digital-to-RF transmitter 500 comprises a complex (in-phase/quadrature) transmitter. However, it will be appreciated that the present invention may equally be implemented within alternative forms of digital-to-RF transmitters.

Figure 16:
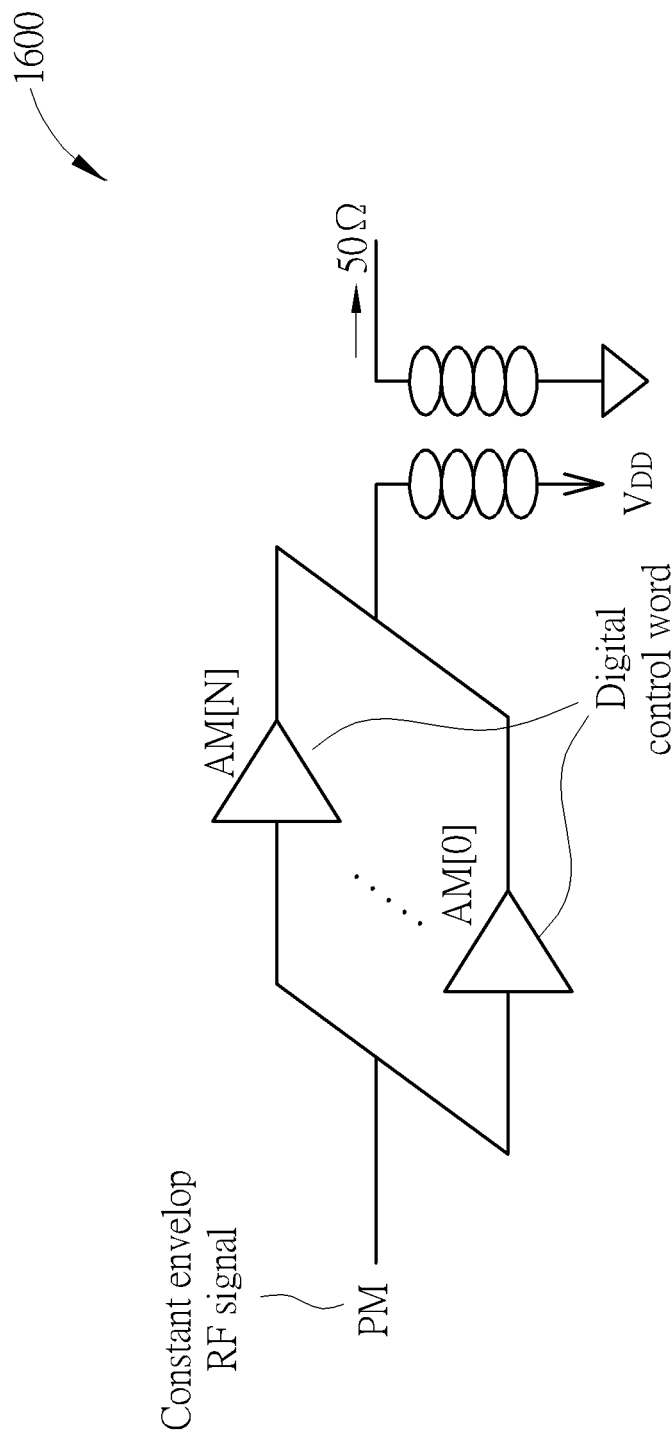
FIGS. 16 to 19 illustrate simplified block diagrams of alternative examples of digital-to-RF transmitters that can benefit from the exemplary embodiments.

For example, it is contemplated that examples of the present invention may be implemented within digital polar transmitters, or hybrid polar transmitters, such as the transmitter 1600 illustrated in FIG. 16. In this example architecture, the clock frequency of AM[0], . . . , AM[N] may be dynamically changed according to one or more of the aforementioned techniques.

Figure 17:
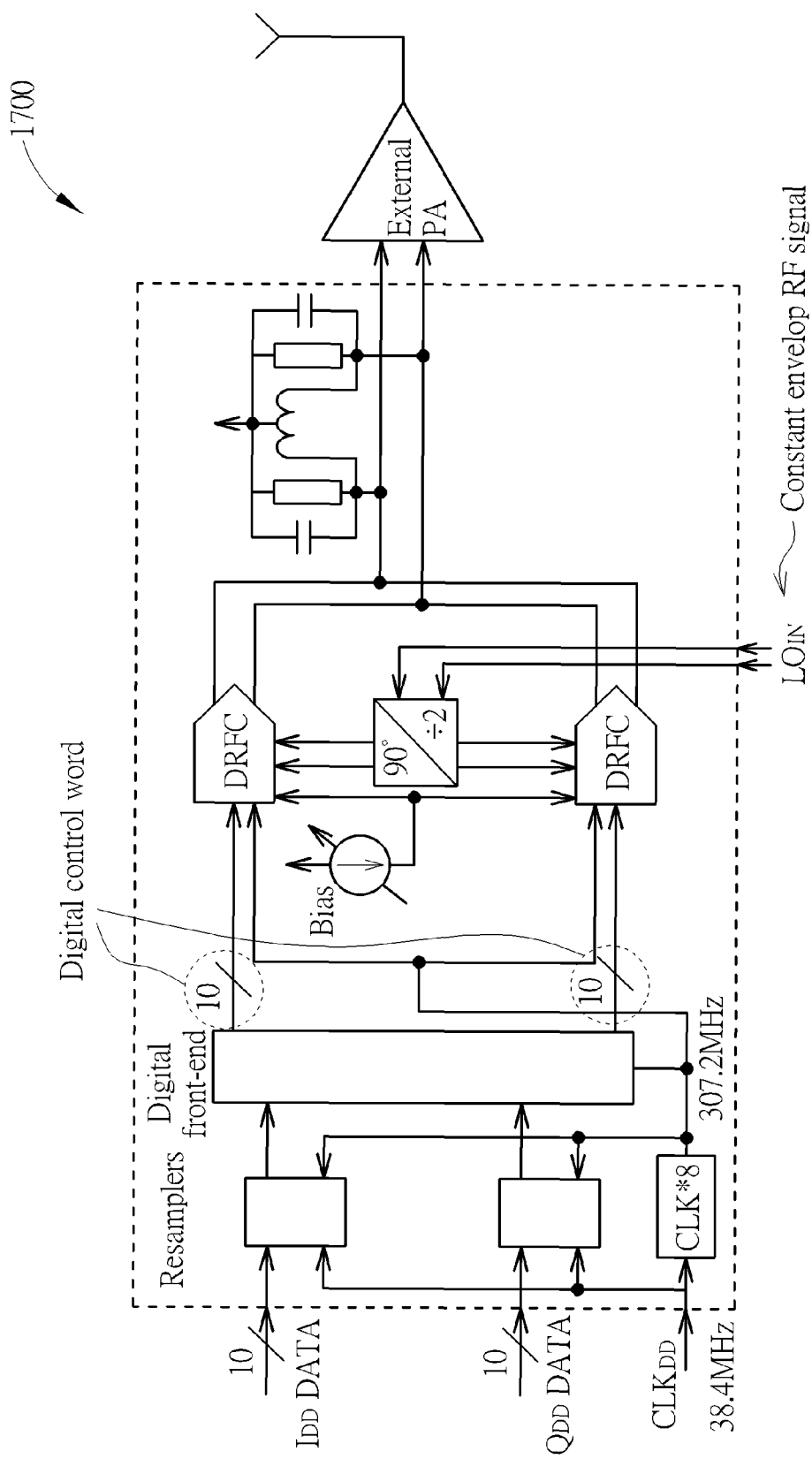

Additionally, it is contemplated that examples of the present invention may be implemented within alternative implementations of complex (in-phase/quadrature) transmitters, such as the complex (in-phase/quadrature) RF DAC transmitter 1700 illustrated in FIG. 17. In this example architecture, the clock frequency of the digital code-word that goes into digital-to-RF converter may be dynamically changed according to one or more of the aforementioned techniques.

Figure 18:
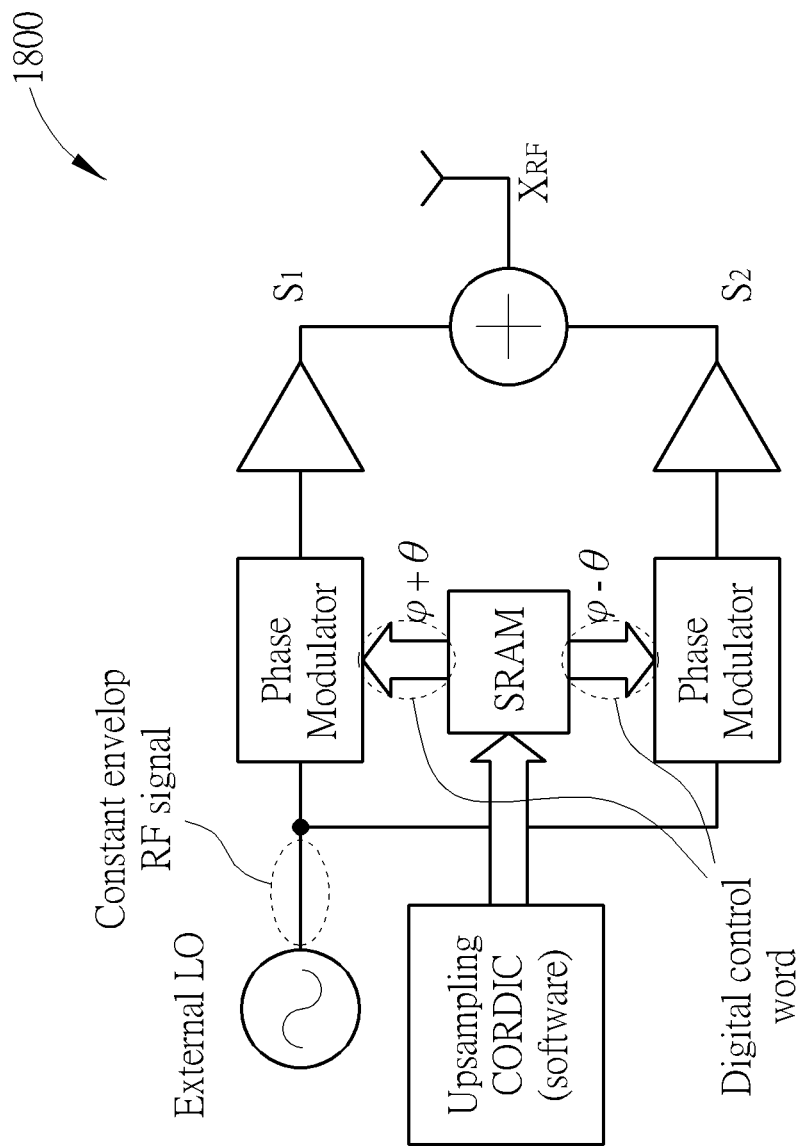

Additionally, it is contemplated that examples of the present invention may be implemented within a digital out-phasing transmitter, such as the digital out-phasing architecture 1800 illustrated in FIG. 18. In this example digital out-phasing transmitter, the modulated phase input set by the digitally controlled word may be dynamically changed according to one or more of the aforementioned techniques.

Figure 19:
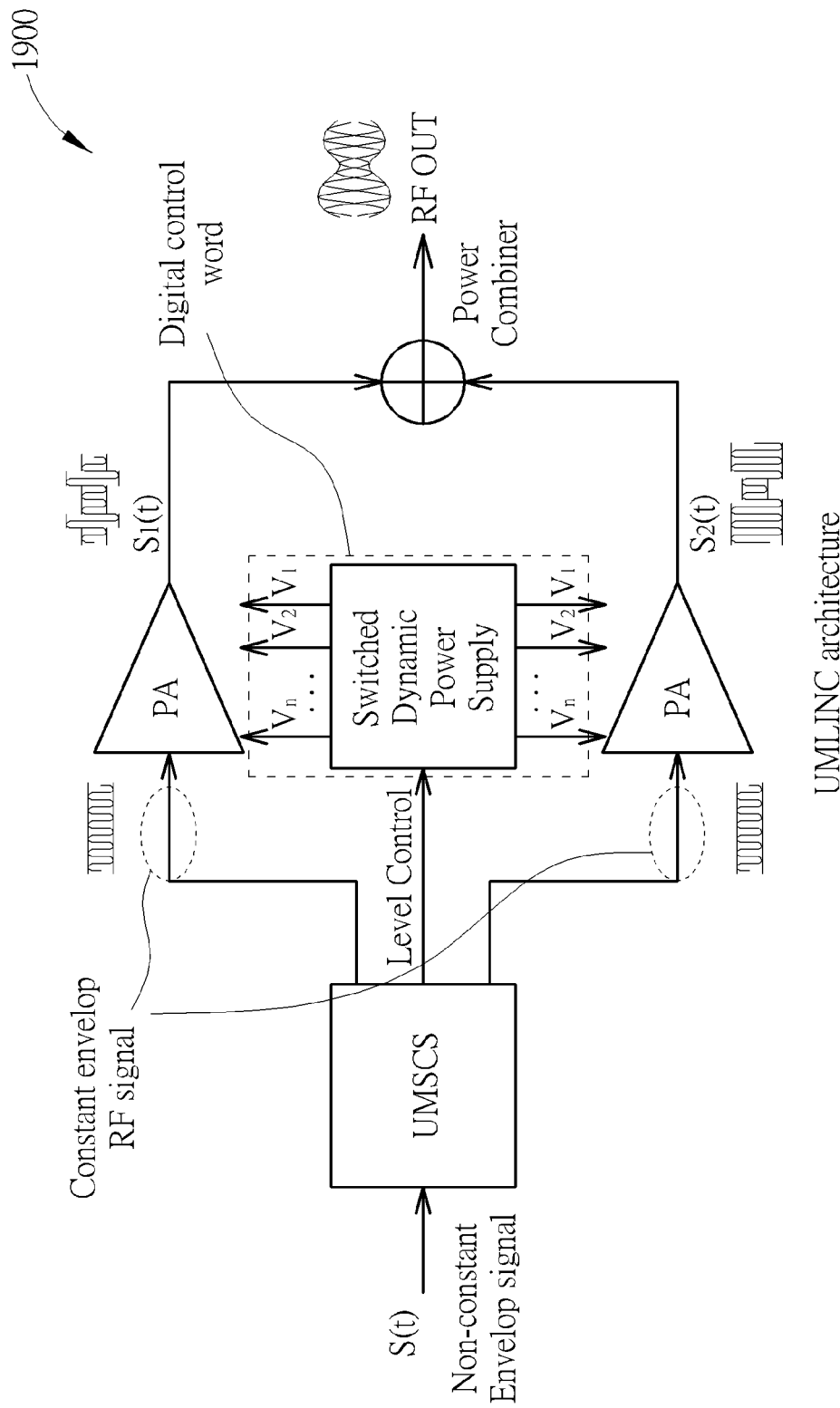

Additionally, it is contemplated that examples of the present invention may be implemented within a LINC (linear amplification using non-linear components) transmitter, such as the LINC transmitter 1900 illustrated in FIG. 19. In this example LINC Transmitter, the clock frequency of a modulated phase input and a switched dynamic power supply may be dynamically changed according to one or more of the aforementioned techniques.

Although examples of the invention have been described with reference to implementation in various digital-to-RF transmitters, it is contemplated that the concepts described herein are equally applicable to other architectures.

The illustrated example embodiments of the present invention have, for the most part, been implemented using electronic components and circuits known to those skilled in the art. Accordingly, details have not been explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an', limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A radio frequency, RF, transmitter comprising:
    a digital power amplifier comprising a plurality of power amplifier cells;
    at least one digital signal processing module operably coupled to the digital power amplifier and comprising at least one digital pre-distortion component arranged to apply at least one digital pre-distortion codeword to the plurality of power amplifier cells,
wherein the at least one digital pre-distortion codeword is applied to at least a first one of the plurality of power amplifier cells and the at least one digital pre-distortion codeword is applied to at least a second one of the plurality of power amplifier cells via at least one digital filter and a phase offset component arranged to introduce a phase offset into a signal path to the at least second one of the plurality of power amplifier cells, wherein the phase offset is representative of a sampling frequency, fs, of at least one digital pre-distortion codeword sequence, x(n) and is configured to attenuate multiples of the sampling frequency, fs; and
    a combiner arranged to combine outputs of the plurality of power amplifier cells thereby generating an analogue RF signal for transmission over an RF interface based at least partly on the digitally filtered at least one digital pre-distortion codeword.

2. The RF transmitter of claim 1 wherein the at least one digital filter is a hybrid poly-phase filter.

3. The RF transmitter of claim 1 wherein the at least one digital pre-distortion codeword is applied to a plurality of the plurality of power amplifier cells via a plurality of different digital filters.

4. The RF transmitter of claim 1 wherein the at least one digital signal processing module is further arranged to receive at least one complex input signal comprising information to be transmitted over an RF interface, and generate the at least one digital pre-distortion codeword from the at least one complex input signal.

5. The RF transmitter of claim 1 wherein the at least one digital signal processing module is further arranged to:
    interpolate a portion of the at least one digital pre-distortion codeword, and
    output the portion of the at least one digital pre-distortion codeword to a portion of the at least one of the plurality of power amplifier cells.

6. The RF transmitter of claim 5 wherein the at least one digital signal processing module is arranged to apply a non-interpolated portion of the at least one digital pre-distortion codeword to a first portion of the at least one of the plurality of power amplifier cells and a sign-changed version of the non-interpolated portion of the at least one digital pre-distortion codeword to a second portion of the at least one of the plurality of power amplifier cells.

7. The RF transmitter of claim 6 wherein the at least one digital signal processing module is operably coupled to a sign bit function and arranged to replace a sign bit of an interpolated portion with a sign bit of the non-interpolated portion.

8. The RF transmitter of claim 6 wherein the at least one digital signal processing module is operably coupled to an absolute function located on an interpolated path and arranged to provide an absolute value of the DPD codeword to a power amplifier cell.

9. The RF transmitter of claim 1 wherein the plurality of power amplifier cells form a switch-mode power cell array of a digital power amplifier module.

10. The RF transmitter of claim 1 comprising at least one from a group of: a complex (in-phase/quadrature) radio frequency digital-to-analogue converter transmitter, a digital polar transmitter, a hybrid polar transmitter, a digital outphasing transmitter, a linear amplification using non-linear components, LINC, transmitter.

11. An integrated circuit device comprising:
at least one digital signal processing module operably couplable to a digital power amplifier comprising a plurality of power amplifier cells, wherein the at least one digital signal processing module comprises:
at least one digital pre-distortion component arranged to apply at least one digital pre-distortion codeword to the plurality of power amplifier cells, wherein the at least one digital pre-distortion codeword is applied to at least a first one of the plurality of power amplifier cells and the at least one digital pre-distortion codeword is applied to at least a second one of the plurality of power amplifier cells via at least one digital filter and a phase offset component arranged to introduce a phase offset into a signal path to the at least second one of the plurality of power amplifier cells, wherein the phase offset is representative of a sampling frequency, fs, of at least one digital pre-distortion codeword sequence, x(n) and is configured to attenuate multiples of the sampling frequency, fs; and
a combiner arranged to combine outputs of the plurality of power amplifier cells thereby generating an analogue RF signal for transmission over an RF interface based at least partly on the digitally filtered at least one digital pre-distortion codeword.

12. A method of generating a radio frequency signal for transmission over a radio frequency, RF, interface, the method comprising:
generating at least one digital pre-distortion codeword;
applying the at least one digital pre-distortion codeword to a plurality of power amplifier cells of a digital power amplifier, wherein the at least one digital pre-distortion codeword is applied to at least a first one of the plurality of power amplifier cells and the at least one digital pre-distortion codeword is applied to at least a second one of the plurality of power amplifier cells via at least one digital filter and a phase offset component arranged to introduce a phase offset into a signal path to the at least second one of the plurality of power amplifier cells, wherein the phase offset is representative of a sampling frequency, fs, of at least one digital pre-distortion codeword sequence, x(n) and is configured to attenuate multiples of the sampling frequency, fs; and
combining outputs of the plurality of power amplifier cells thereby generating an analogue RF signal for transmission over an RF interface based at least partly on the digitally filtered at least one digital pre-distortion codeword.

13. A radio frequency, RF, transmitter comprising:
a digital power amplifier comprising a plurality of power amplifier cells;
at least one digital signal processing module operably coupled to the digital power amplifier and comprising at least one digital pre-distortion component arranged to:
interpolate only a portion of at least one digital pre-distortion codeword,
output the portion of the at least one digital pre-distortion codeword to a portion of at least one power amplifier cell of the digital power amplifier thereby generating an analogue RF signal for transmission over the RF interface based at least partly on the interpolated portion of the at least one digital pre-distortion codeword; and
apply a non-interpolated portion of the at least one digital pre-distortion codeword to a first portion of the at least one of the plurality of power amplifier cells and the non-interpolated portion of the at least one digital pre-distortion codeword to a sign-change function, to generate a sign-changed bit of the non-interpolated portion of the at least one digital pre-distortion codeword to be applied to a second portion of the at least one of the plurality of power amplifier cells.

14. An integrated circuit device comprising:
at least one digital signal processing module operably couplable to a digital power amplifier comprising a plurality of power amplifier cells, wherein the at least one digital signal processing module comprises:
at least one digital pre-distortion component arranged to:
interpolate only a portion of at least one digital pre-distortion codeword,
output the portion of the at least one digital pre-distortion codeword to a portion of at least one power amplifier cell of the digital power amplifier thereby generating an analogue RF signal for transmission over the RF interface based at least partly on the interpolated portion of the at least one digital pre-distortion codeword; and
apply a non-interpolated portion of the at least one digital pre-distortion codeword to a first portion of the at least one of the plurality of power amplifier cells and the non-interpolated portion of the at least one digital pre-distortion codeword to a sign-change function, to generate a sign-changed bit of the non-interpolated portion of the at least one digital pre-distortion codeword to be applied to a second portion of the at least one of the plurality of power amplifier cells.

15. A method of generating a radio frequency, RF, signal for transmission over a radio frequency interface, the method comprising:
generating at least one digital pre-distortion codeword;
applying the at least one digital pre-distortion codeword to a plurality of power amplifier cells of a digital power amplifier;
interpolating only a portion of the at least one digital pre-distortion codeword,
outputting the portion of the at least one digital pre-distortion codeword to a portion of at least one power amplifier cell of the digital power amplifier thereby generating an analogue RF signal for transmission over the RF interface based at least partly on the interpolated portion of the at least one digital pre-distortion codeword; and
applying a non-interpolated portion of the at least one digital pre-distortion codeword to a first portion of the at least one of the plurality of power amplifier cells and the non-interpolated portion of the at least one digital pre-distortion codeword to a sign-change function, to generate a sign-changed bit of the non-interpolated portion of the at least one digital pre-distortion codeword to be applied to a second portion of the at least one of the plurality of power amplifier cells.

* * * * *